(12) United States Patent
Lin et al.

(10) Patent No.: US 11,152,455 B2
(45) Date of Patent: Oct. 19, 2021

(54) METHOD TO REDUCE BREAKDOWN FAILURE IN A MIM CAPACITOR

(71) Applicant: Taiwan Semiconductor Manufacturing Co., Ltd., Hsin-Chu (TW)

(72) Inventors: Hsing-Lien Lin, Hsin-Chu (TW); Chii-Ming Wu, Taipei (TW); Chia-Shiung Tsai, Hsin-Chu (TW); Chung-Yi Yu, Hsin-Chu (TW); Rei-Lin Chu, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/579,738

(22) Filed: Sep. 23, 2019

(65) Prior Publication Data

US 2021/0091169 A1 Mar. 25, 2021

(51) Int. Cl.
*H01L 21/00* (2006.01)
*H01L 23/52* (2006.01)
(Continued)

(52) U.S. Cl.
CPC .......... *H01L 28/60* (2013.01); *H01L 21/0234* (2013.01); *H01L 21/02252* (2013.01);
(Continued)

(58) Field of Classification Search
CPC ........ H01L 21/02252; H01L 21/02315; H01L 21/76825
(Continued)

(56) References Cited

U.S. PATENT DOCUMENTS 5,514,908 A 5/1996 Liao et al.
6,355,571 B1 * 3/2002 Huang .................. B08B 7/0035
438/706
(Continued)

FOREIGN PATENT DOCUMENTS

KR 20080032879 A 9/2008
KR 20080084434 A 9/2008
KR 20100078496 A 7/2010

OTHER PUBLICATIONS

Pittenger et al. "Quantitative Mechanical Property Mapping at the Nanoscale with PeakForce QNM." Bruker Nano Surfaces Divison, published in 2012.
(Continued)

*Primary Examiner* — Calvin Lee
(74) *Attorney, Agent, or Firm* — Eschweiler & Potashnik, LLC

(57) ABSTRACT

Various embodiments of the present application are directed towards a method for forming a metal-insulator-metal (MIM) capacitor comprising an enhanced interfacial layer to reduce breakdown failure. In some embodiments, a bottom electrode layer is deposited over a substrate. A native oxide layer is formed on a top surface of the bottom electrode layer and has a first adhesion strength with the top surface. A plasma treatment process is performed to replace the native oxide layer with an interfacial layer. The interfacial layer is conductive and has a second adhesion strength with the top surface of the bottom electrode layer, and the second adhesion strength is greater than the first adhesion strength. An insulator layer is deposited on the interfacial layer. A top electrode layer is deposited on the insulator layer. The top and bottom electrode layers, the insulator layer, and the interfacial layer are patterned to form a MIM capacitor.

20 Claims, 19 Drawing Sheets

(51) Int. Cl.
  *H01L 49/02* (2006.01)
  *H01L 21/768* (2006.01)
  *H01L 21/02* (2006.01)
  *H01L 23/64* (2006.01)
  *H01L 27/22* (2006.01)

(52) U.S. Cl.
  CPC .. *H01L 21/02315* (2013.01); *H01L 21/76825* (2013.01); *H01L 21/76841* (2013.01); *H01L 23/642* (2013.01); *H01L 27/224* (2013.01)

(58) Field of Classification Search
  USPC .......... 257/753, 783; 438/550, 660, 795–799
  See application file for complete search history.

(56) References Cited

U.S. PATENT DOCUMENTS

| | | | | |
|---|---|---|---|---|
| 6,774,048 B2* | 8/2004 | Baek | ................ | H01L 21/31116 |
| | | | | 438/758 |
| 7,232,757 B2* | 6/2007 | Noguchi | ........... | H01L 21/02063 |
| | | | | 438/687 |
| 7,504,674 B2* | 3/2009 | Farrar | ............... | H01L 21/76801 |
| | | | | 257/213 |
| 7,601,648 B2* | 10/2009 | Chua | .................... | H01L 29/513 |
| | | | | 438/763 |
| 10,243,128 B2* | 3/2019 | Hayashi | ................. | H01L 35/02 |
| 10,593,777 B2 | 3/2020 | Kim | | |
| 2004/0144311 A1* | 7/2004 | Chen | ................. | C23C 16/45561 |
| | | | | 118/715 |
| 2006/0040457 A1 | 2/2006 | Lee et al. | | |
| 2008/0318378 A1 | 12/2008 | Wu et al. | | |
| 2012/0088360 A1 | 4/2012 | Kim et al. | | |
| 2012/0309160 A1 | 12/2012 | Ramini et al. | | |
| 2014/0017508 A1* | 1/2014 | Lee | .................... | C23C 18/2006 |
| | | | | 428/551 |
| 2015/0001673 A1 | 1/2015 | Li et al. | | |
| 2015/0262812 A1 | 9/2015 | Liu et al. | | |
| 2015/0318343 A1 | 11/2015 | Kim et al. | | |
| 2016/0163781 A1 | 6/2016 | Lin et al. | | |
| 2017/0117282 A1 | 4/2017 | Mathur et al. | | |
| 2020/0279601 A1 | 9/2020 | Kim et al. | | |

OTHER PUBLICATIONS

Bruker. "Quasi-Static Nanoindentation: An Overivew." The date of publication is unknown. Retrieved online on Jul. 11, 2019 from https://www.bruker.com/products/surface-and-dimensional-analysis/nanomechanical-test-instruments/anding-pages/nanoindentation.html.

Kuiry, Suresh. "Advanced Scratch Testing for Evaluation of Coatings." Bruker, published on May 8, 2012.

U.S. Appl. No. 17/022,320, filed Sep. 16, 2020.

* cited by examiner

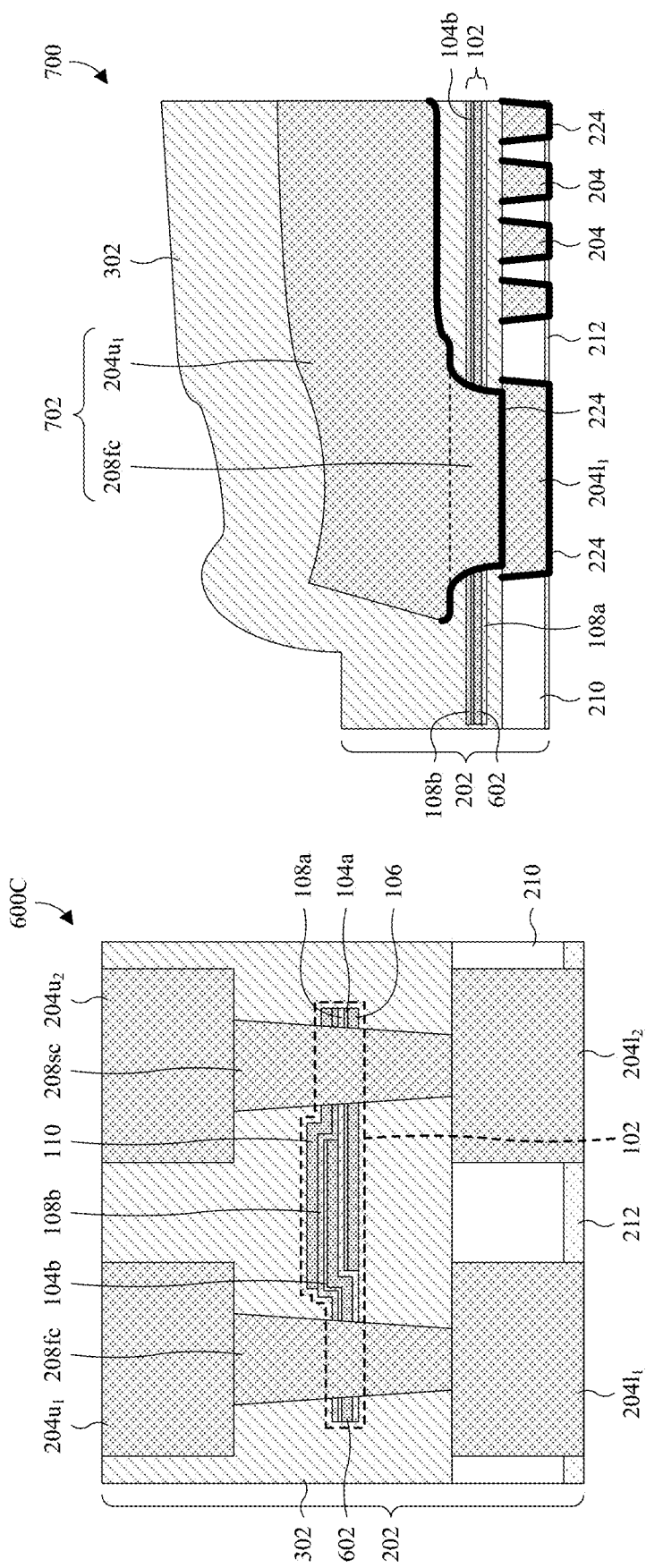

METHOD TO REDUCE BREAKDOWN FAILURE IN A MIM CAPACITOR

BACKGROUND

Integrated circuits (ICs) are formed on semiconductor dies comprising millions or billions of transistor devices. The transistor devices are configured to act as switches and/or to produce power gains so as to enable logical functionality. ICs also comprise passive devices used to control gains, time constants, and other IC characteristics. One type of passive device is a metal-insulator-metal (MIM) capacitor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6C illustrate cross-sectional views of some embodiments of an IC chip comprising an interconnect structure in which planar embodiments of the MIM capacitor of FIG. 1 are embedded.

FIG. 7 illustrates a cross-sectional view of some alternative embodiments of a portion of the IC chip of FIG. 6C at a first capacitor via.

DETAILED DESCRIPTION

Figure 2A:
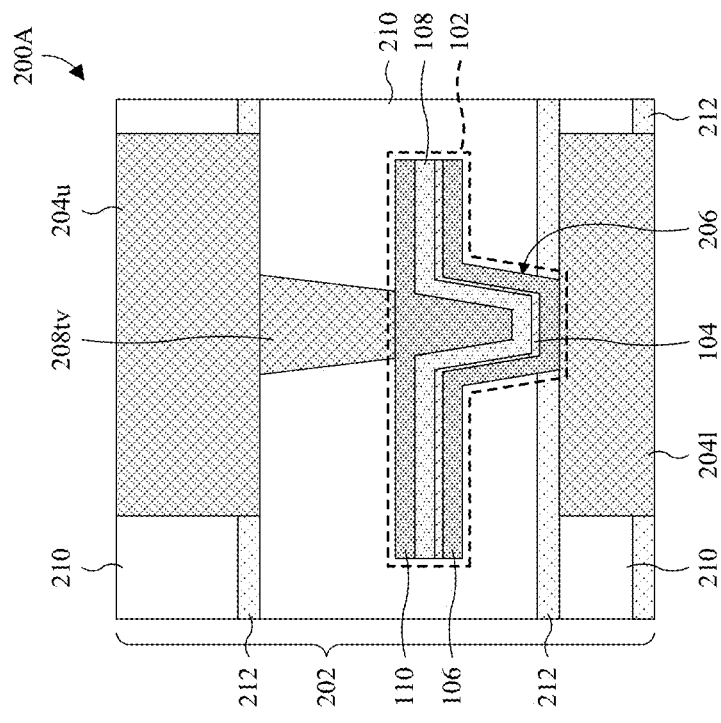
FIGS. 2A-2E illustrate cross-sectional views of some embodiments of an integrated circuit (IC) chip comprising an interconnect structure in which some first trench embodiments of the MIM capacitor of FIG. 1 are embedded.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A metal-insulator-metal (MIM) capacitor comprises a bottom electrode, a capacitor insulator layer overlying the bottom electrode, and a top electrode overlying the capacitor insulator layer. A method for forming the MIM capacitor may, for example, comprise depositing a bottom electrode layer over a substrate, depositing an insulator layer on the bottom electrode layer, depositing a top electrode layer on the insulator layer, and patterning the various layers (e.g., the insulator layer) into the MIM capacitor. Challenges may, however, arise at least when the bottom electrode layer and the insulator layer are formed of titanium nitride and a high k dielectric. A high k dielectric may, for example, be a dielectric material having a dielectric constant greater than about 10 or some other suitable value.

When the bottom electrode layer and the insulator layer are formed of titanium nitride and a high k dielectric material, the bottom electrode layer and the insulator layer may be formed in separate process chambers. For example, the bottom electrode layer may be formed in a physical vapor deposition (PVD) process chamber, whereas insulator layer may be formed in an atomic layer deposition (ALD) process chamber. However, forming the bottom electrode layer and the insulator layer in separate process chambers may lead to air exposure. The air exposure leads to oxidation of a top surface of the bottom electrode layer and hence to formation of a native oxide layer on the top surface. The oxidation increases a roughness of the top surface of the bottom electrode, which may degrade electric field uniformity across the capacitor insulator layer and may hence degrade performance of the MIM capacitor. The native oxide layer has weak adhesion with the top surface of the bottom electrode layer and is hence prone to delamination from the top surface. Further, the likelihood of delamination is exacerbated at high voltages and/or high temperatures, which may be at or greater than operating limitations of the MIM capacitor. The high voltages may, for example, be voltages greater than or equal to about 3.5 volts or some other suitable voltage, and/or the high temperatures may, for example, be temperatures greater than or equal to about 125 degrees Celsius or some other suitable temperature. Because the native oxide layer is prone to delamination, the MIM capacitor is prone to dielectric breakdown and has a low time-dependent dielectric breakdown (TDDB).

Aside from dielectric breakdown, the native oxide layer poses a number of other challenges. The native oxide layer has a high concentration of charge traps and a low energy band gap, such that the native oxide layer serves as a "step" for charge carriers to reach a sufficiently high energy level to pass through the insulator layer. This, in turn, aids charge carriers in passing through the insulator layer, increases leakage current, and increases capacitance-voltage (CV) dispersion. Further, the native oxide layer is dielectric and hence results in a parasitic capacitance in series with a primary capacitance of the insulator layer. Because of the series relationship, overall capacitance is degraded. Further yet, the native oxide layer allows an oxidant used to form the insulator layer to pass to the top surface of the bottom electrode and to further oxidize the bottom electrode. This enlarges the native oxide layer and makes it difficult to precisely control a thickness of the bottom electrode layer.

Various embodiments of the present application are directed towards a MIM capacitor comprising an enhanced interfacial layer to reduce breakdown failure, as well as a method for forming the MIM capacitor. In some embodiments, a bottom electrode layer is deposited over a substrate. A native oxide layer is formed on a top surface of the bottom electrode layer and has a first adhesion strength with the top surface of the bottom electrode layer. A plasma treatment process is performed to convert the native oxide layer and a top portion of the bottom electrode layer into an interfacial layer. The interfacial layer is conductive and has a second adhesion strength with the top surface of the bottom electrode layer that is greater than the first adhesion strength. An insulator layer is deposited on the interfacial layer, and a top electrode layer is deposited on the insulator layer. The bottom and top electrode layers, the interfacial layer, and the insulator layer are patterned to form a MIM capacitor. In some embodiments, the plasma treatment process is or comprises a nitrogen oxide (e.g., $N_2O$) plasma treatment process, the bottom electrode layer is or comprises titanium nitride, the interfacial layer is or comprises titanium oxynitride, or any combination of the foregoing.

By performing the plasma treatment, the top surface of the bottom electrode layer is smoothed. For example, ion bombardment from the plasma treatment may smooth the top surface of the bottom electrode layer. Further, the interfacial layer is formed in place of the native oxide layer and has a greater adhesion strength with the top surface of the bottom electrode layer than the native oxide layer. The greater adhesion strength, in turn, prevents delamination of the interfacial layer from the top surface of the bottom electrode layer. Hence, dielectric breakdown is reduced and TDDB is enhanced. Additionally, by performing the plasma treatment, negative effects of the native oxide layer may be reduced or eliminated. Charge traps in the native oxide layer may be repaired while the native oxide is converted to the interfacial layer. This, in turn, reduces leakage current and CV dispersion. Further, because the interfacial layer is conductive, the interfacial layer doesn't result in parasitic capacitance in series with a primary capacitance of the insulator layer. Hence, the interfacial layer doesn't degrade an overall capacitance of the MIM capacitor. Further yet, the interfacial layer may block diffusion of an oxidant used during formation of the insulator layer. This prevents the top surface of the bottom electrode layer from being oxidized and reducing a thickness of the bottom electrode layer. Further, if the top surface of the bottom electrode layer oxidized, the resulting oxide layer may lead to the same challenges described above for the native oxide layer.

Figure 1:
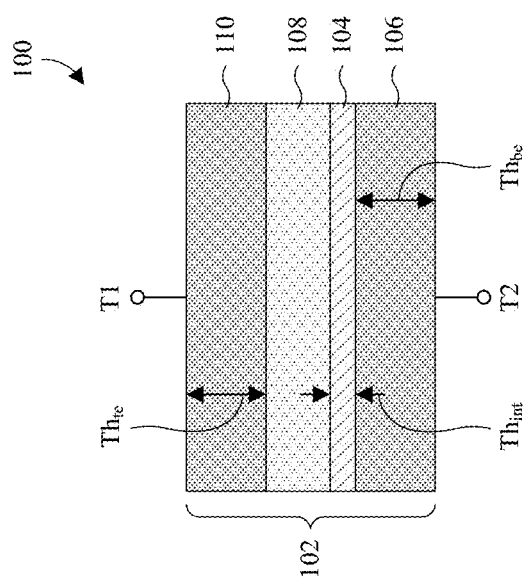
FIG. 1 illustrates a cross-sectional view of some embodiments of a metal-insulator-metal (MIM) capacitor comprising an interfacial layer enhanced to reduce breakdown failure.

With reference to FIG. 1, a cross-sectional view 100 of some embodiments of a metal-insulator-metal (MIM) capacitor 102 comprising a capacitor interfacial layer 104 is provided in which the capacitor interfacial layer 104 is enhanced to, among other things, reduce breakdown failure. The capacitor interfacial layer 104 overlies a bottom electrode 106, a capacitor insulator layer 108 overlies the capacitor interfacial layer 104, and a top electrode 110 overlies the capacitor insulator layer 108. The top electrode 110 defines or is otherwise electrically coupled to a first terminal T1 of the MIM capacitor 102, and the bottom electrode 106 defines or is otherwise electrically coupled to a second terminal T2 of the MIM capacitor.

The bottom electrode 106 and the top electrode 110 are conductive and may, for example, be or comprise titanium, titanium nitride, tantalum, tantalum nitride, some other suitable conductive material(s), or any combination of the foregoing. In some embodiments, a thickness $Th_{be}$ of the bottom electrode 106 is about 150-400 angstroms, about 150-275 angstroms, or about 275-400 angstroms and/or a thickness $Th_{te}$ of the top electrode 110 is about 400-600 angstroms, about 400-500 angstroms, or about 500-600 angstroms. Other thicknesses are, however, amenable for the bottom and top electrodes 106, 110. In some embodiments, a top surface of the bottom electrode 106 has a low average surface roughness. In some embodiments, surface roughness is quantified according to atomic force microscopy. Other processes are, however, amenable for quantifying surface roughness. In some embodiment, the low average surface roughness of the bottom electrode 106 is about 0.30-0.40 nanometers, about 0.30-0.35 nanometers, about 0.35-0.40 nanometers, about 0.36 nanometers, or about 0.34 nanometers according to atomic force microscopy. Other surface roughness values are, however, amenable.

The capacitor insulator layer 108 is dielectric and may, for example, be or comprise, zirconium oxide, aluminum oxide, hafnium oxide, silicon oxide, some other suitable dielectric(s), or any combination of the foregoing. In some embodiments, the capacitor insulator layer 108 is or comprises a metal oxide and/or is or comprises a high k dielectric. A high k dielectric may, for example, be a dielectric material having a dielectric constant greater than about 10 or some other suitable value.

The capacitor interfacial layer 104 is conductive throughout and has a high adhesion strength with the bottom electrode 106. In some embodiments, adhesion strength is quantified by nanoscratch testing. Other processes are, however, amenable for quantifying adhesion. Nanoscratch testing may, for example, comprise applying a linearly increasing force to a layer (e.g., the capacitor interfacial layer 104) on the bottom electrode 106 using a probe until adhesive failure. The force at which adhesive failure occurs represents adhesion strength. The more adhesive the layer is, the greater the force at which adhesive failure occurs. In some embodiment, the high adhesion strength of the capacitor interfacial layer 104 is about 1000-3000 micronewtons or greater than about 1000 micronewtons according to nano-scratch testing. Other adhesion values are, however, amenable. Below an adhesion of about 1000 micronewtons or some other suitable adhesion value, failure rates may be high. In some embodiments, the high adhesion strength of the capacitor interfacial layer 104 is greater than a native oxide layer would have with the bottom electrode 106.

Because of the high adhesion strength, the likelihood of the capacitor interfacial layer 104 delaminating (i.e., reaching adhesive failure) is low. Hence, dielectric breakdown is reduced for the MIM capacitor 102 and TDDB is increased for the MIM capacitor 102. Further, because the capacitor interfacial layer 104 is conductive, the capacitor interfacial layer 104 doesn't result in parasitic capacitance in series with a primary capacitance of the capacitor insulator layer 108. Hence, the capacitor interfacial layer 104 doesn't degrade an overall capacitance of the MIM capacitor 102. Note that two capacitors in series have a combined capacitance less than individual capacitances of the two capacitors.

The capacitor interfacial layer 104 may, for example, be or comprise titanium oxynitride, tantalum oxynitride, some other suitable conductive material(s), or any combination of the foregoing. In some embodiments, the capacitor interfacial layer 104 is or comprises $TiO_xN_y$. In some embodiments, x is greater than 0 and less than about 2 and y is less than about x. In some of such embodiments, y is also greater than 0. In alternative embodiments, x and y have other suitable values. In some embodiments, x decreases (i.e., oxygen decreases) from a top surface of the capacitor interfacial layer 104 to a bottom surface of the capacitor interfacial layer 104 and/or y increases (i.e., nitrogen increases) from the top surface to the bottom surface. The decrease and/or the increase may, for example, be continuous. In some embodiments, the bottom electrode 106 comprises or consists of a metal element and non-metal element and the capacitor interfacial layer 104 comprises or consists of oxygen, the metal element, and the non-metal element. The metal element may, for example, be titanium, tantalum, or some other suitable metal element, and/or the non-metal element may, for example, be nitrogen or some other suitable non-metal element. In alternative embodiments, the bottom electrode 106 consists of or consists essentially of the metal element and the capacitor interfacial layer 104 comprises or consists of oxygen, the metal element, and the non-metal element.

In some embodiments, the capacitor interfacial layer 104 is a diffusion barrier for oxidants. Oxidants may, for example, be used during formation of the capacitor insulator layer 108. Absent the capacitor interfacial layer 104 being a diffusion barrier, oxidants could diffuse to the bottom electrode 106 and oxidize the top surface of the bottom electrode 106 during formation of the capacitor insulator layer 108. This would, in turn, reduce a thickness $T_{be}$ of the bottom electrode 106 and would make it difficult to control the thickness $T_{be}$ of the bottom electrode 106. Further, a resulting oxide layer would create a parasitic capacitance in series with the primary capacitance of the capacitor insulator layer 108. Because of the series relationship, overall capacitance of the MIM capacitor 102 would be degraded.

In some embodiments, the capacitor interfacial layer 104 has a thickness $T_{int}$ between about 20-50 angstroms, about 20-35 angstroms, about 35-50 angstroms, or some other suitable thickness. If the thickness $T_{int}$ of the capacitor interfacial layer 104 is too small (e.g., less than about 20 angstroms or some other suitable value), the capacitor interfacial layer 104 may be be unable to block diffusion of oxidants during formation of the capacitor insulator layer 108. Further, process limitations may limit the thickness $T_{int}$ of the capacitor interfacial layer 104 to less than about 50 angstroms or some other suitable value. For example, attempting to form the capacitor interfacial layer 104 with a thickness more than about 50 angstroms using nitrogen oxide plasma treatment may result in a dielectric oxide layer. The dielectric oxide layer would induce parasitic capacitance in series with the primary capacitance of the capacitor insulator layer 108 and would degrade overall capacitance of the MIM capacitor 102.

In some embodiments, the MIM capacitor 102 has low CV dispersion. CV dispersion may, for example, be quantified as $$\frac{C - C_0}{C_0},$$

where C is capacitance of the MIM capacitor 102 at an operating voltage and $C_0$ is capacitance of the MIM capacitor 102 at 0 volts. Other approaches for quantifying CV dispersion are, however, amenable. The lower CV dispersion is, the more uniform capacitance of the MIM capacitor 102 is over a range of operating voltages. In some embodiment, the low CV dispersion of the MIM capacitor 102 is about 0.36, about 0.30, about 0.30-0.40, or less than about 0.35. Other CV dispersion values are, however, amenable. In some embodiments, the low CV dispersion of the MIM capacitor 102 is low compared to that of a MIM capacitor with a native oxide layer in place of the capacitor interfacial layer 104.

The MIM capacitor 102 may, for example, have the low CV dispersion because the capacitor interfacial layer 104 is conductive. As a result, the capacitor interfacial layer 104 doesn't result in parasitic capacitance and doesn't facilitate leakage paths through the capacitor insulator layer 104. This is in contrast with a MIM capacitor having a native oxide layer in place of the capacitor interfacial layer 104. The native oxide layer results in a parasitic capacitance and further results in leakage paths that individually and/or collectively degrade CV dispersion. The parasitic capacitance results because the native oxide layer is dielectric. Leakage paths results because the native oxide layer has a high concentration of crystalline defects and a low energy band gap that provides a "step" for carriers to reach a sufficiently high energy level to pass through the capacitor insulator layer 108.

With reference to FIG. 2A, a cross-sectional view 200A of some embodiments of an integrated circuit (IC) chip comprising an interconnect structure 202 is provided in which some first trench embodiments of the MIM capacitor 102 of FIG. 1 are embedded. The MIM capacitor 102 overlies a lower capacitor wire 204l and has a downward protrusion defining a bottom electrode via (BEVA) 206. An upper capacitor wire 204u overlies the MIM capacitor 102, and a top electrode via (TEVA) 208tv extends from the upper capacitor wire 204u to the MIM capacitor 102. The lower capacitor wire 204l, the upper capacitor wire 204u, and the TEVA 208*tv* are conductive and may be or comprise, for example, aluminum copper, aluminum, copper, some other suitable metal(s), or any combination of the foregoing.

The MIM capacitor 102, the lower capacitor wire 204*l*, the upper capacitor wire 204*u*, and the TEVA 208*tv* are surrounded by a plurality of intermetal dielectric (IMD) layers 210. The IMD layers 210 are stacked upon each other and, in some embodiments, a plurality of etch stop layers 212 separate the IMD layers 210 from each other. In alternative embodiments, the etch stop layers 212 are omitted. The IMD layers 210 are a different material than the etch stop layers 212 and may, for example, be or comprise a low k dielectric and/or some other suitable dielectric(s). The etch stop layers 212 may, for example, be silicon carbide, some other suitable dielectric(s), or any combination of the foregoing.

Figure 2C:
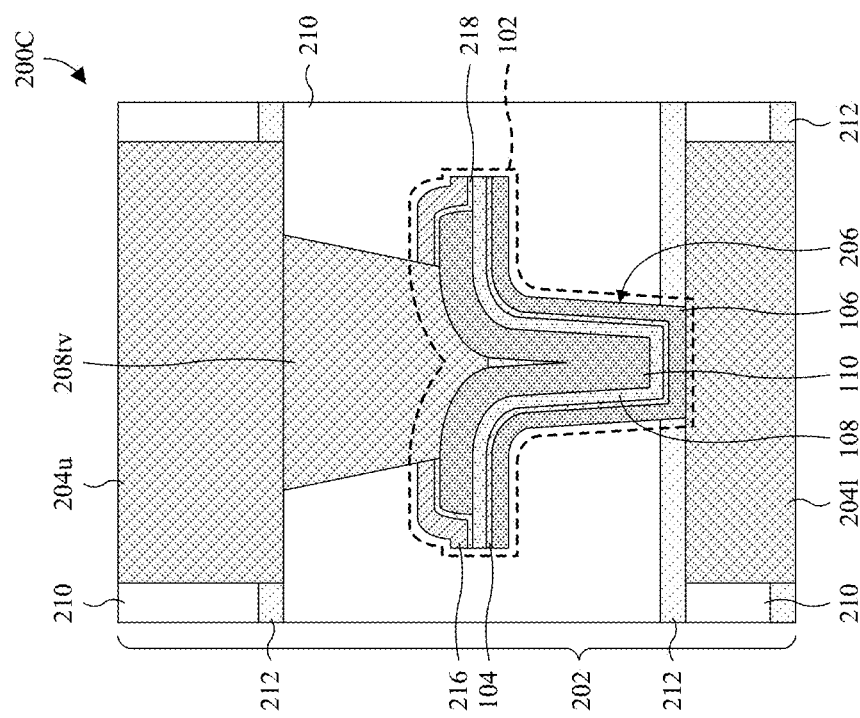
Figure 2B:
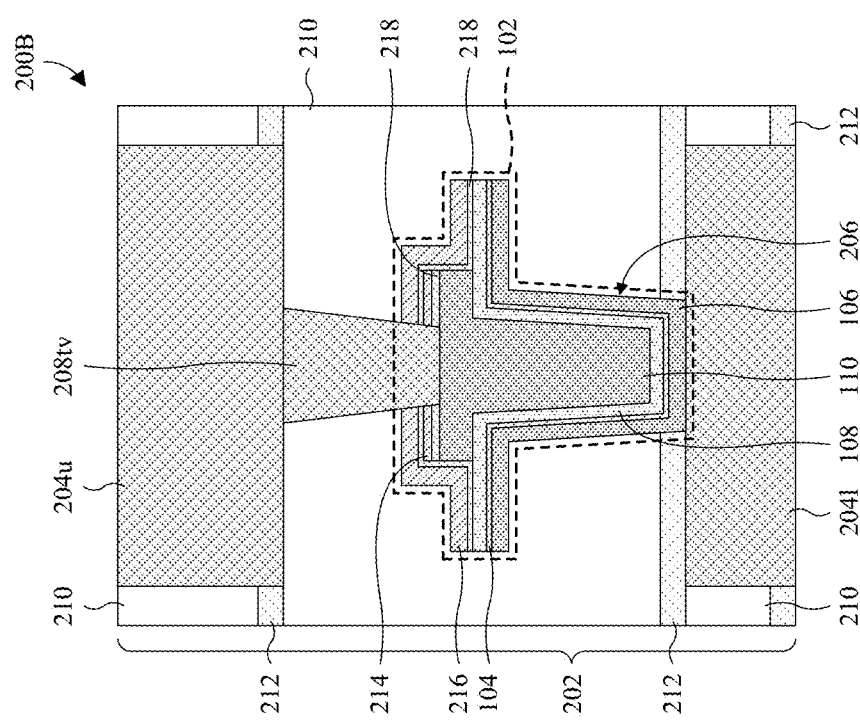

With reference to FIG. 2B, a cross-sectional view 200B of some alternative embodiments of the IC chip of FIG. 2A is provided in which the MIM capacitor 102 has a more symmetrical profile about a vertical axis at a width-wise center of the MIM capacitor 102. Further, hard masks cover the MIM capacitor 102. A top electrode hard mask 214 covers and has the same or substantially the same top layout as the top electrode 110. A bottom electrode hard mask 216 covers and has the same or substantially the same top layouts as the bottom electrode 106, the capacitor insulator layer 108, and the capacitor interfacial layer 104. Further, the bottom electrode hard mask 216 covers the top electrode hard mask 214. In alternative embodiments, the capacitor insulator layer 108 instead has the same or substantially the same top layout as the top electrode hard mask 214. The top and bottom electrode hard masks 214, 216 may be or comprise, for example, silicon nitride and/or some other suitable dielectric(s).

In some embodiments, hard mask liners 218 are individual to the top and bottom electrode hard masks 214, 216 and separate the top and bottom electrode hard masks 214, 216 from the capacitor insulator layer 108 and the top electrode 110. The hard mask liners 218 are different materials than the top and bottom electrode hard masks 214, 216 and may be or comprise, for example, silicon oxide and/or some other suitable dielectric(s). In alternative embodiments, the hard mask liners 218 are omitted.

With reference to FIG. 2C, a cross-sectional view 200C of some alternative embodiments of the IC chip of FIG. 2B is provided in which the top electrode 110 is indented at the BEVA 206. Further, the bottom electrode 106, the capacitor interfacial layer 104, the capacitor insulator layer 108, and the top electrode 110 have more curved edges. Further yet, the top electrode hard mask 214 and its corresponding hard mask liners 218 are omitted. In alternative embodiments, the top electrode hard mask 214 and its corresponding hard mask liners 218 remain on the top electrode 110 and separate the top electrode 110 from the bottom electrode hard mask 216 and its corresponding hard mask liners 218.

Figure 2E:
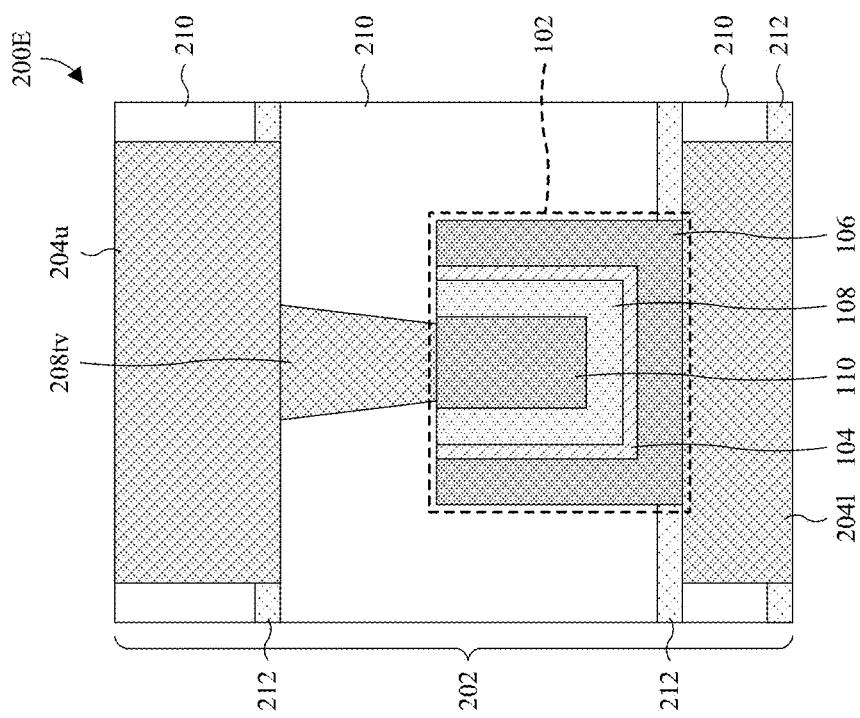
Figure 2D:
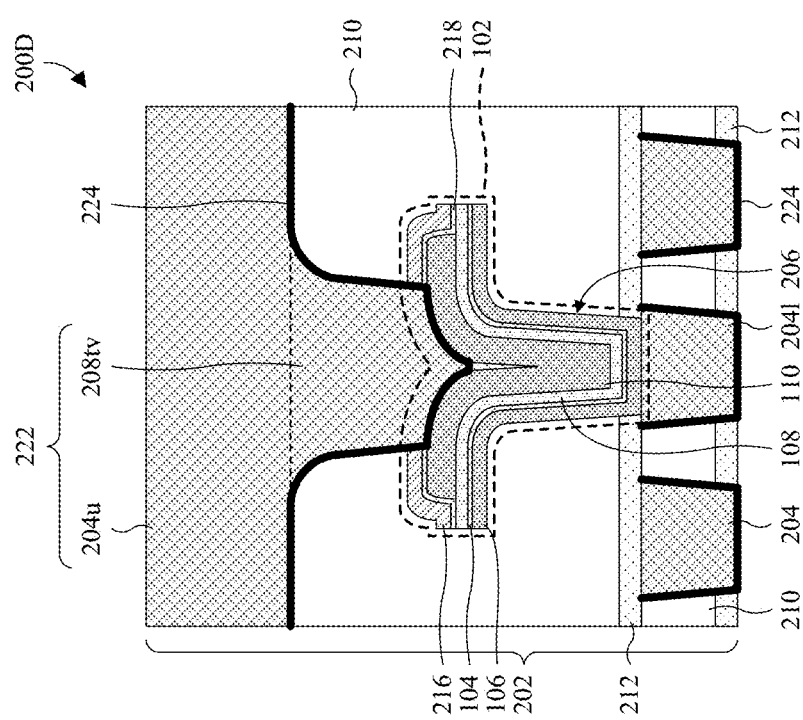

With reference to FIG. 2D, a cross-sectional view 200D of some alternative embodiments of the IC chip of FIG. 2C is provided in which the MIM capacitor 102 overlies a plurality of additional wires 204. Further, an etch stop layer 212 at the upper capacitor wire 204*u* is omitted, and the TEVA 208*tv* and the upper capacitor wire 204*u* are integrated into a conductive structure 222. Further yet, the conductive structure 222, the lower capacitor wire 204*l*, and the plurality of additional wires 204 are lined by interconnect barrier layers 224. The interconnect barrier layers 224 are configured to prevent diffusion of material from the conductive structure 222, the lower capacitor wire 204*l*, and the plurality of additional wires 204 to underlying structure. In some embodiments, the conductive structure 222, the lower capacitor wire 204*l*, and the plurality of additional wires 204 are or comprise copper. In some embodiments, the interconnect barrier layers 224 are or comprise titanium, tantalum, titanium nitride, tantalum nitride, or some other suitable barrier material. Other materials are, however, amenable. In some embodiments, the interconnect barrier layers 224 and the capacitor interfacial layer 104 are or comprise a same material.

With reference to FIG. 2E, a cross-sectional view 200E of some alternative embodiments of the IC chip of FIG. 2A are provided in which the BEVA 206 is omitted. Further, the capacitor insulator layer 108 cups an underside of the top electrode 110, the capacitor interfacial layer 104 cups an underside of the capacitor insulator layer 108, and the bottom electrode 106 cups an underside of the capacitor interfacial layer 104. In some embodiments, the bottom electrode 106, the capacitor interfacial layer 104, the capacitor insulator layer 108, and the top electrode 110 have U or V shaped profiles. Other profiles are, however, amenable.

Figure 3B:
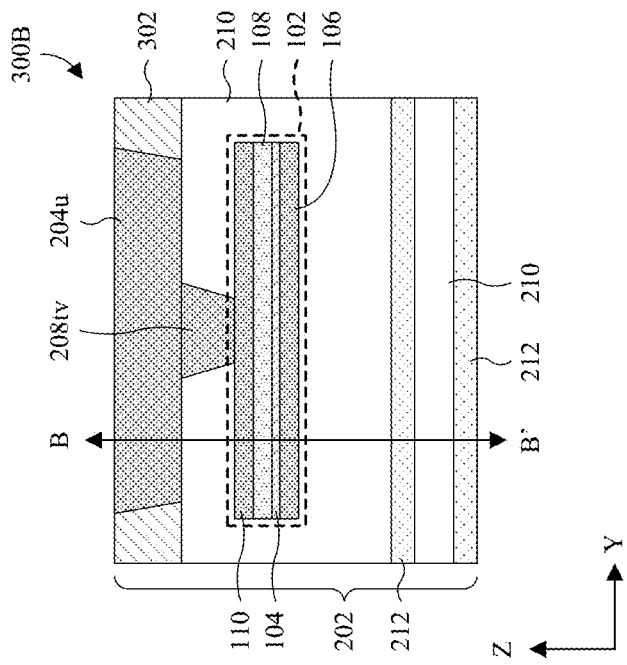
FIGS. 3A and 3B illustrate orthogonal cross-sectional views of some alternative embodiments of the IC chip of FIG. 2A in which an upper capacitor wire is in a passivation layer.
Figure 3A:
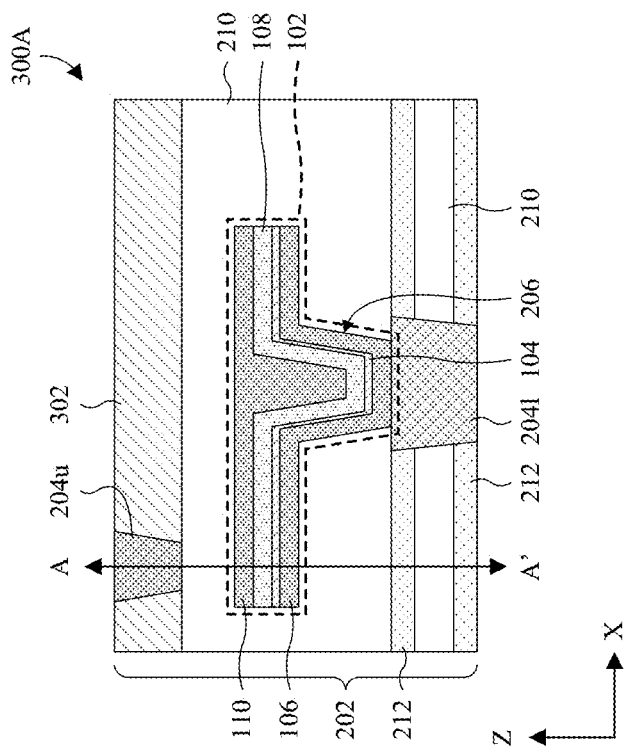

With reference to FIGS. 3A and 3B, orthogonal cross-sectional views 300A, 300B of some alternative embodiments of the IC chip of FIG. 2A is provided in which the upper capacitor wire 204*u* is in a passivation layer 302 and an etch stop layer 212 at the upper capacitor wire 204*u* is omitted. In alternative embodiments, the MIM capacitor 102 is replaced with the MIM capacitor 102 in any one of FIGS. 2B-2E or some other suitable MIM capacitor. The cross-sectional view 300A of FIG. 3A is taken in an X direction and may, for example, be taken along line B-B' in FIG. 3B. The cross-sectional view 300B of FIG. 3B is taken in a Y direction and may, for example, be taken along line A-A' in FIG. 3A.

The passivation layer 302 overlies the IMD layers 210 and accommodates the upper capacitor wire 204*u*. As seen in FIG. 3B, the TEVA 208*tv* extends from the upper capacitor wire 204*u* to the MIM capacitor 102. The passivation layer 302 is or comprises a different dielectric material than the IMD layers 210. In some embodiments, the IMD layers 210 are or comprise a low k dielectric having a dielectric constant less than about 3.9, 3.0, or some suitable value, whereas the passivation layer 302 is or comprises a dielectric having a dielectric constant greater than the IMD layers 210. In at least some of these embodiments, the passivation layer 302 has a dielectric constant between about 3.9-10 or greater than about 3.9. Other dielectric constants are, however, amenable for the IMD layers 210 and/or the passivation layer 302.

Figure 4B:
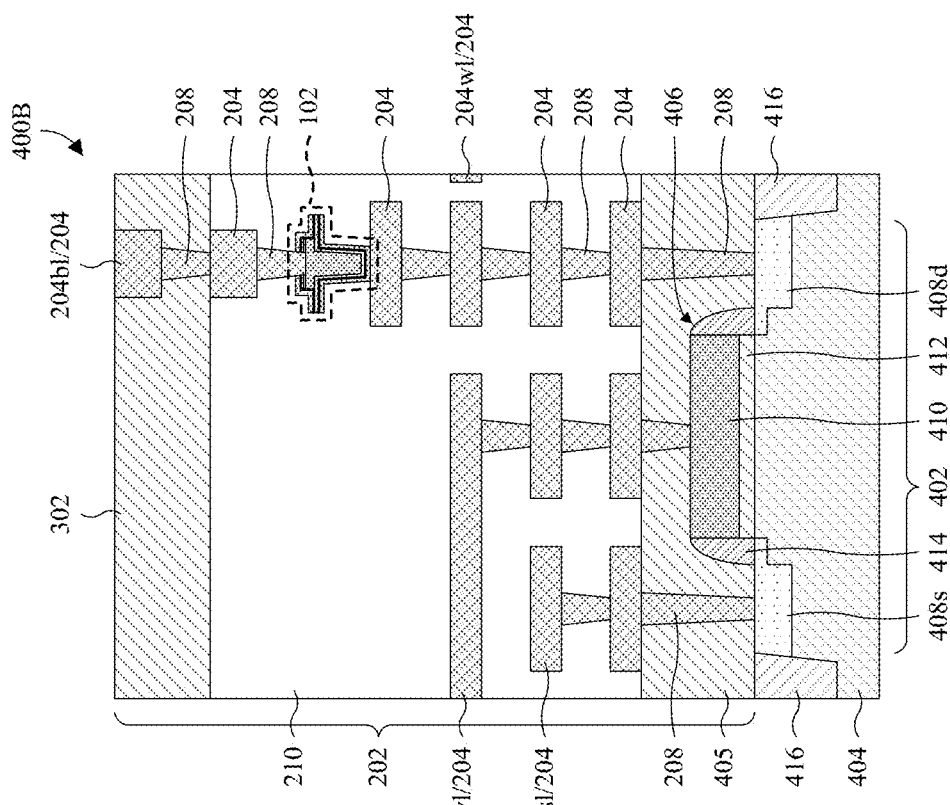
FIGS. 4A and 4B illustrate cross-sectional views of some embodiments of an IC chip comprising a one-transistor one-capacitor (1T1C) cell in which the MIM capacitors of FIGS. 2A and 2B are embedded.
Figure 4A:
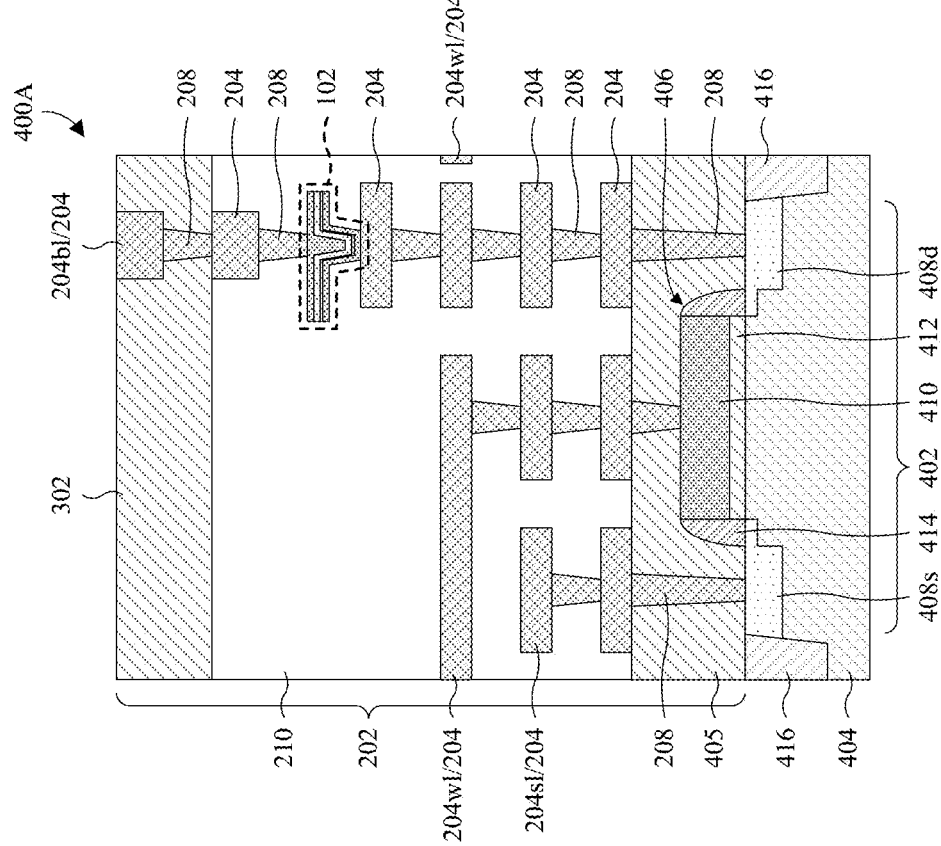

With reference to FIG. 4A, a cross-sectional view 400A of some embodiments of an IC chip comprising a one-transistor one-capacitor (1T1C) cell 402 is provided in which the MIM capacitor 102 of FIG. 2A is embedded. The MIM capacitor 102 overlies a substrate 404 in an interconnect structure 202. The substrate 404 may be, for example, a bulk silicon substrate and/or some other suitable semiconductor substrate.

The interconnect structure 202 comprises an interlayer dielectric (ILD) layer 405, an IMD layer 210, and a passivation layer 302 stacked over the substrate 404. The IMD layer 210 overlies the ILD layer 405, and the passivation layer overlies the IMD layer 210. The ILD layer 405 is a different material than the IMD layer 210 and may, for example, be or comprise silicon oxide and/or some other suitable dielectric. Further, the interconnect structure 202 comprises a plurality of wires 204 and a plurality of vias 208 stacked in the ILD, IMD, and passivation layers 405, 210, 302. The plurality of wires 204 and the plurality of vias 208 are conductive and define conductive paths leading from the MIM capacitor 102 and an underlying access transistor 406. A first conductive path leads from the MIM capacitor 102 to a bit line 204bl above the MIM capacitor 102. A second conductive path leads from the MIM capacitor 102 to a drain region 408d of the access transistor 406. A third conductive path leads from a source region 408s of the access transistor 406 to a source line 204sl above the source region 408s. A fourth conductive path leads from a gate electrode 410 of the access transistor 406 to a word line 204w l above the gate electrode 410. Note that while the word line 204wl is shown with two separate segments on opposite sides of the drain region 408d, the word line 204wl may be continuous outside the cross-sectional view 300A.

The access transistor 406 comprises the drain and source regions 408d, 408s, and further comprises the gate electrode 410 and a gate dielectric layer 412. The drain and source regions 408d, 408s are in the substrate 404 and correspond to doped regions of the substrate 404. The gate electrode 410 overlies the gate dielectric layer 412 and is sandwiched between the drain and source regions 408d, 408s. In some embodiments, a sidewall spacer structure 414 is on sidewalls of the gate electrode 410 and/or the access transistor 406 is surrounded by a trench isolation structure 416. The sidewall spacer structure 414 and the trench isolation structure 416 are or comprise dielectric material(s). The access transistor 406 may, for example, be an insulated gate field-effect transistor (IGFET) or some other suitable transistor.

With reference to FIG. 4B, a cross-sectional view 400B of some alternative embodiments of the IC chip of FIG. 4A is provided in which the MIM capacitor 102 of FIG. 2A is replaced with the MIM capacitor 102 of FIG. 2B. In some other alternative embodiments of the IC chip of FIG. 4A, the MIM capacitor 102 of FIG. 2A is replaced with the MIM capacitor 102 in any one of FIGS. 2C-2E, 3A, and 3B or some other suitable MIM capacitor.

Figure 5:
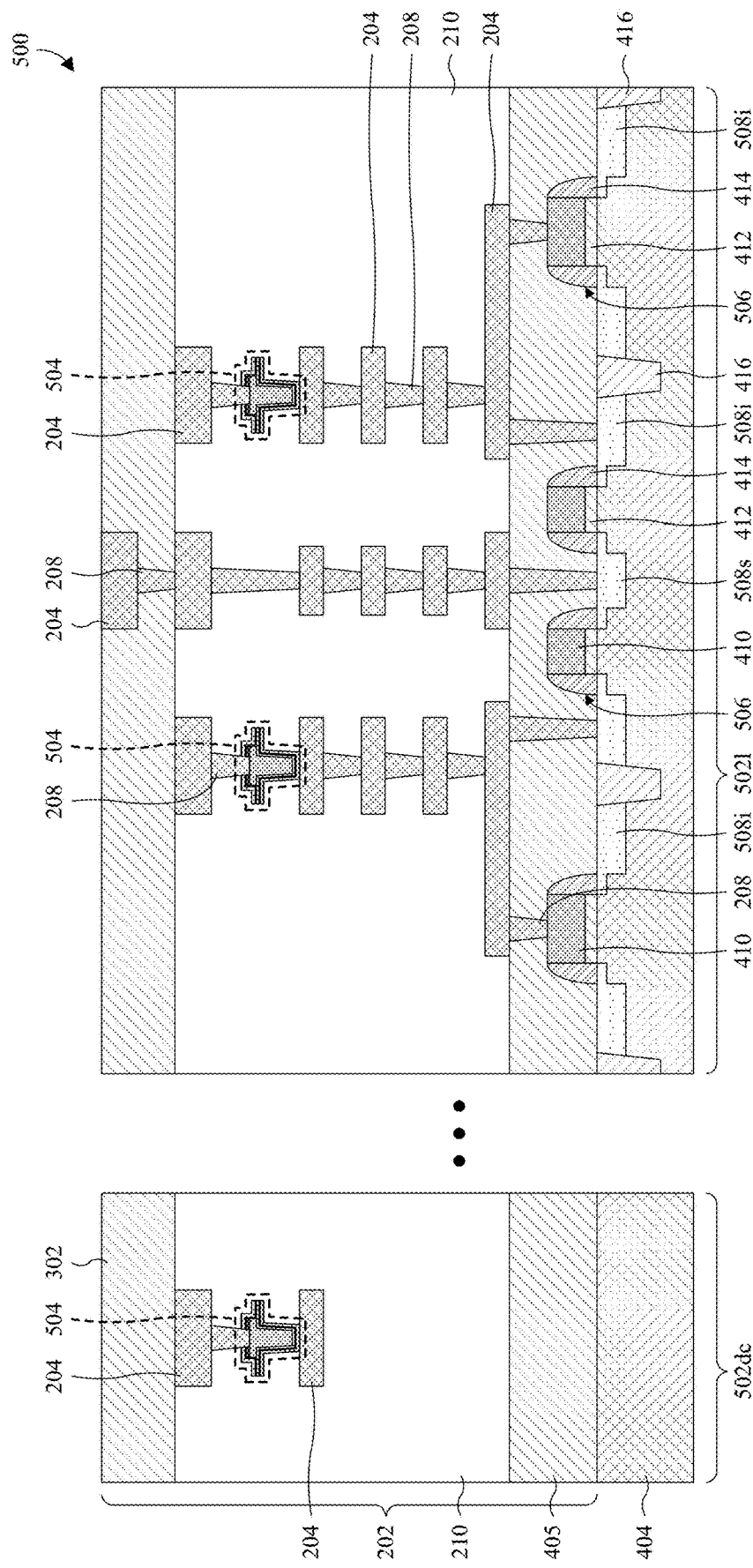
FIG. 5 illustrates a cross-sectional view of some embodiments of an IC chip comprising a decoupling-capacitor region and a logic region in which MIM capacitors are at the decoupling-capacitor and logic regions and configured as the MIM capacitor of FIG. 2B.

With reference to FIG. 5, a cross-sectional view 500 of some embodiments of an IC chip comprising a decoupling-capacitor region 502dc and a logic region 502l is provided in which multiple MIM capacitors 504 are in the decoupling-capacitor and logic regions 502dc, 502l and are each configured as the MIM capacitor 102 of FIG. 2B. In some alternative embodiments of the IC chip of FIG. 5, the MIM capacitors 504 are each configured as the MIM capacitor 102 in any one of FIGS. 2A, 2C-2E, 3A, and 3B or some other suitable MIM capacitor.

An interconnect structure 202 overlies a substrate 404. The interconnect structure 202 and/or the substrate 404 may, for example, be as described with regard to FIG. 4A. The interconnect structure 202 comprises an ILD layer 405, an IMD layer 210 overlying the ILD layer 405, and a passivation layer 302 overlying the IMD layer 210. Further, the interconnect structure comprises a plurality of wires 204 and a plurality of vias 208 stacked in the ILD, IMD, and passivation layers 405, 210, 302. The plurality of wires 204 and the plurality of vias 208 are conductive and define conductive paths leading from the MIM capacitors 504 and also from multiple transistors 506 under the MIM capacitors 504. In some embodiments, there are no wires and vias, except for the illustrated wire 204, directly under the MIM capacitor 504 at the decoupling-capacitor region 502dc.

The transistors 506 may, for example, each be configured as the access transistor 406 of FIG. 4A and/or may, for example, each be an IGFET or some other suitable transistor. The transistors 506 comprise individual source/drain regions 508i, individual gate electrodes 410, and individual gate dielectric layers 412. Further, two of the transistors 506 that neighbor each other share a shared source/drain region 508s. The gate electrodes 410 overlie the gate dielectric layers 412 and are each sandwiched between two of the individual and/or shared source/drain regions 508i, 508s. In some embodiments, sidewall spacer structures 414 are individual to the gate electrodes 410 and line sidewalls of the gate electrodes 410. In some embodiments, the transistors 506 are surrounded and separated by a trench isolation structure 416. In some embodiments, there are no transistors and/or other semiconductor devices on the substrate 404 and directly under the MIM capacitor 504 at the decoupling-capacitor region 502dc.

While the MIM capacitor 102 in the IC chip of FIG. 4A or 4B is shown as being between the fourth and fifth wire levels, the MIM capacitor 102 may be between any other neighboring wire levels in alternative embodiments. Similarly, while the MIM capacitors 504 in the IC chip of FIG. 5 are shown as being between the fourth and fifth wire levels, the MIM capacitors 504 may be between any other neighboring wire levels in alternative embodiments. Further, while the MIM capacitor 102 in the IC chip of FIG. 4A or 4B is shown as being in the IMD layer 210, the MIM capacitor 102 may be in the passivation layer 302 or the ILD layer 405 in alternative embodiments. Similarly, while the MIM capacitors 504 in the IC chip of FIG. 5 are shown as being in the IMD layer 210, the MIM capacitors 504 may be in the passivation layer 302 or the ILD layer 405 in alternative embodiments.

Figure 6B:
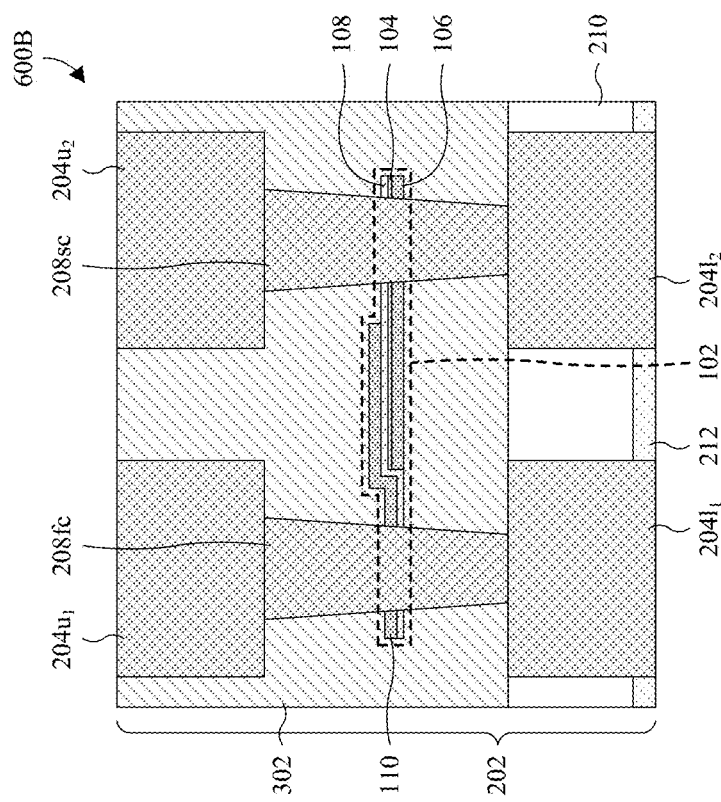
Figure 6A:
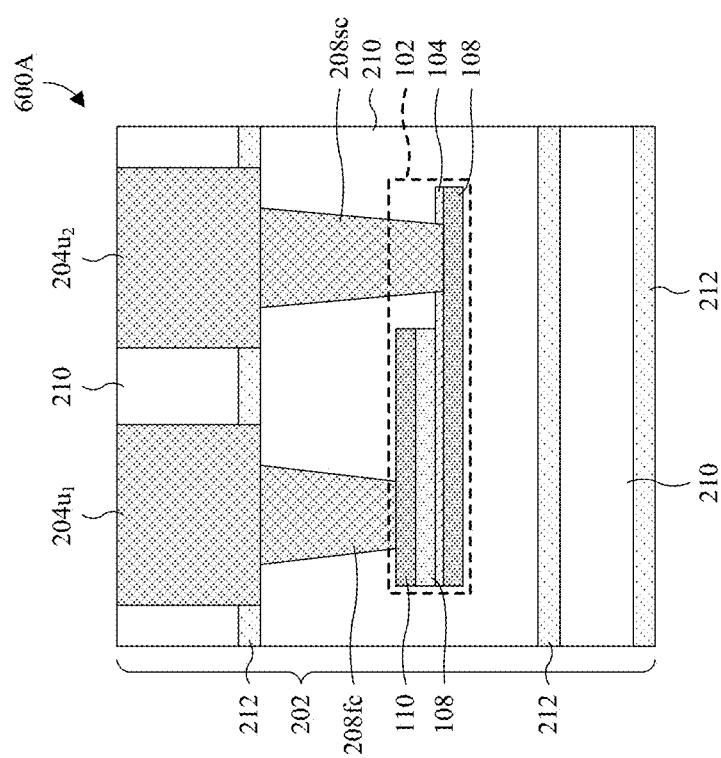

With reference to FIG. 6A, a cross-sectional view 600A of some embodiments of an IC chip comprising an interconnect structure 202 is provided in which planar embodiments of the MIM capacitor 102 of FIG. 1 are embedded. The planar embodiments of the MIM capacitor 102 are to be contrasted with the first trench embodiments of the MIM capacitor 102 in FIGS. 2A-2E. The MIM capacitor 102 fills a trench (e.g., to define the BEVA 206) in the first trench embodiments, whereas the MIM capacitor 102 does not in FIG. 6A. As such, the MIM capacitor 102 of FIG. 6A has a planar or substantially planar bottom profile.

The MIM capacitor 102 underlies a first upper capacitor wire $204u_1$ and a second upper capacitor wires $204u_2$. A first capacitor via 208fc extends from the top electrode 110 to the first upper capacitor wire $204u_1$ to electrically couple the first upper capacitor wires $204u_1$ to the top electrode 110. Similarly, a second capacitor via 208sc extends from the bottom electrode 106 to the second upper capacitor wire $204u_2$ to electrically couple the second upper capacitor wire $204u_2$ to the bottom electrode 106. A plurality of IMD layers 210 surround the MIM capacitor 102, the first upper capacitor wire $204u_1$, and the second upper capacitor wire $204u_2$. In some embodiments, etch stop layers 212 separate the IMD layers 210 from each other. In alternative embodiments, the etch stop layers 212 are omitted.

With reference to FIG. 6B, a cross-sectional view 600B of some alternative embodiments of the IC chip of FIG. 6A is provided in which the top electrode 110 has a stepped profile. Further, the MIM capacitor 102 is in a passivation layer 302 that overlies an IMD layer 210, and the first and second capacitor vias 208fc, 208sc extend through and electrically couple with the MIM capacitor 102. The first capacitor via 208fc extends through the top electrode 110, from the first upper capacitor wire $204u_1$ to a first lower capacitor wire $204l_1$. Similarly, the second capacitor via 208sc extends through the bottom electrode 106, from the second upper capacitor wire $204u_2$ to a second lower capacitor wire $204l_2$.

With reference to FIG. 6C, a cross-sectional view 600C of some alternative embodiments of the IC chip of FIG. 6B is provided in which the MIM capacitor 102 further comprises a middle electrode 602. The middle electrode 602 is between the bottom and top electrodes 106, 110. A first capacitor interfacial layer 104a is on a top surface of the bottom electrode 106, and a second capacitor interfacial layer 104b is on a top surface of the middle electrode 602. A first capacitor insulator layer 108a is between the bottom and middle electrodes 106, 602 and separates the first capacitor interfacial layer 104a and the bottom electrode 106 from middle electrode 602 and the top electrode 110. A second capacitor insulator layer 108b is between the top electrode 110 and the bottom electrode 106 and also between the top electrode 110 and the middle electrode 602. Further, the second capacitor insulator layer 108b separates the second capacitor interfacial layer 104b, the middle electrode 602, and the first capacitor insulator layer 108a from the top electrode 110.

The bottom electrode 106 and the first capacitor interfacial layer 104a are respectively as the bottom electrode 106 and the capacitor interfacial layer 104 are described with regard to FIG. 1. Similarly, the middle electrode 602 and the second capacitor interfacial layer 104b are respectively as the bottom electrode 106 and the capacitor interfacial layer 104 are described with regard to FIG. 1. As such, the first and second capacitor interfacial layers 104a, 104b reduce dielectric breakdown and enhance TDDB of the MIM capacitor 102. The first and second capacitor insulator layers 108a, 108b and the top electrode 110 are respectively as the capacitor insulator layer 108 and the top electrode 110 are described with regard to FIG. 1.

The first capacitor via 208fc extends through the middle electrode 602, from the first upper capacitor wire 204$u_1$ to the first lower capacitor wire 204$l_1$, and electrically couples with the middle electrode 602. Similarly, the second capacitor via 208sc extends through the bottom and top electrodes 106, 110, from the second upper capacitor wire 204$u_2$ to the second lower capacitor wire 204$l_2$, and electrically couples with the bottom and top electrodes 106, 110. Because the second capacitor via 208sc electrically couples to both the bottom and top electrodes 106, 110 and the bottom and top electrodes 106, 110 are respectively under and over the middle electrode 602, the MIM capacitor can be modeled as two capacitors in parallel. A first capacitor is defined between the bottom and middle electrodes 106, 602, and a second capacitor is defined between the top and middle electrodes 110, 602.

With reference to FIG. 7, a cross-sectional view 700 of some alternative embodiments of a portion of the IC chip of FIG. 6C at the first capacitor via 208fc is provided in which the MIM capacitor 102 overlies a plurality of additional wires 204. Further, the first capacitor via 208fc and the first upper capacitor wire 204$u_1$ are continuous with each other and integrated into a conductive structure 702 having rounded corners and uneven surfaces. Further yet, the passivation layer 302 covers the conductive structure 702 and has a top surface that substantially conforms to the conductive structure 702. Further yet, the first lower capacitor wire 204$l_1$, the conductive structure 702, and the plurality of additional wires 204 are lined by interconnect barrier layers 224. The interconnect barrier layers 224 are configured to prevent diffusion of material from the first lower capacitor wire 204$l_1$, the conductive structure 702, and the plurality of additional wires 204 to underlying structure.

Figure 8B:
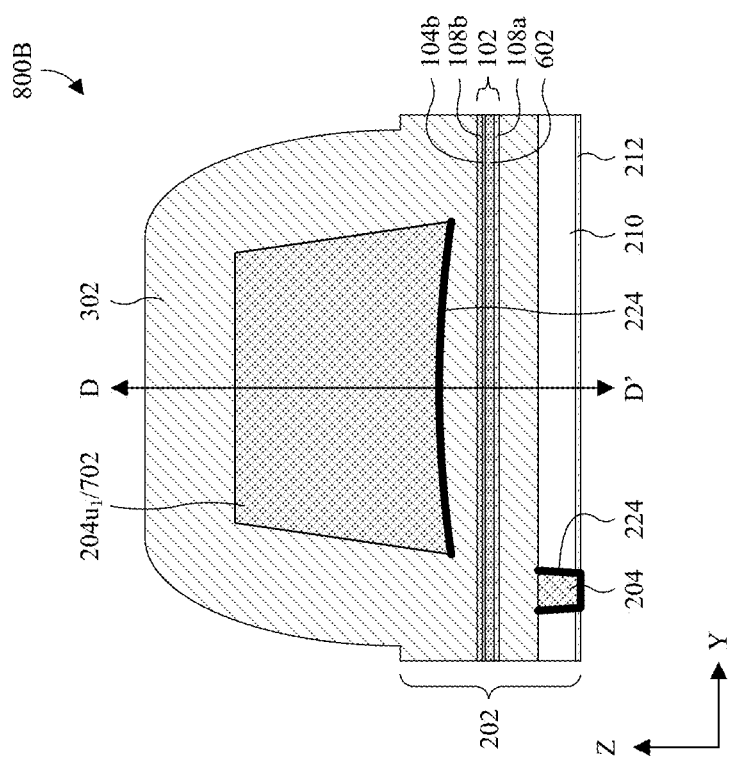
FIGS. 8A and 8B illustrate orthogonal cross-sectional views of some alternative embodiments of a portion of the IC chip of FIG. 7.
Figure 8A:
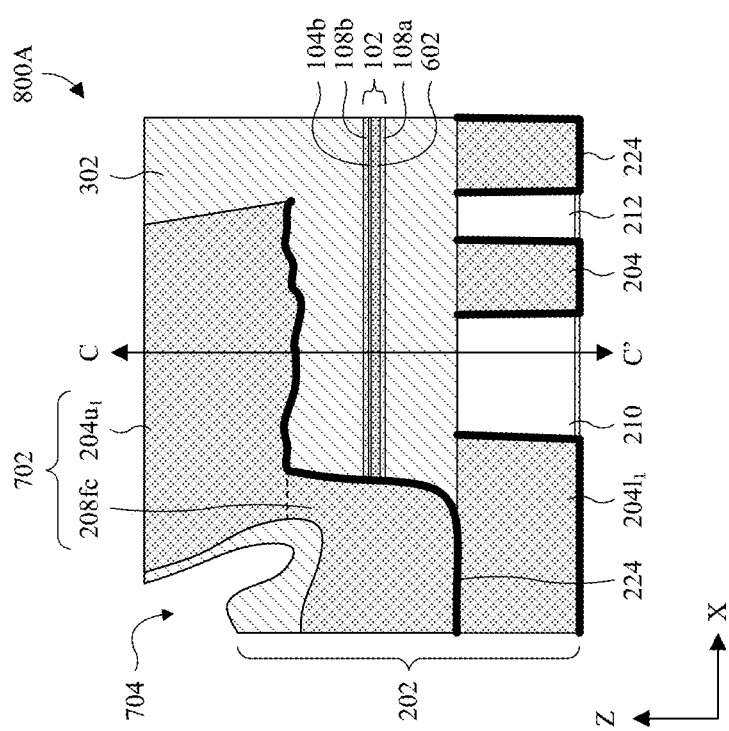

With reference to FIGS. 8A and 8B, orthogonal cross-sectional views 800A, 800B of some alternative embodiments of a portion of the IC chip of FIG. 7 is provided in which the conductive structure 702 has a top indent 704 extending to the first capacitor via 208fc. The cross-sectional view 800A of FIG. 8A is taken in an X direction and may, for example, be taken along line D-D' in FIG. 8B. The cross-sectional view 800B of FIG. 8B is taken in a Y direction and may, for example, be taken along line C-C' in FIG. 8A.

Figure 9:
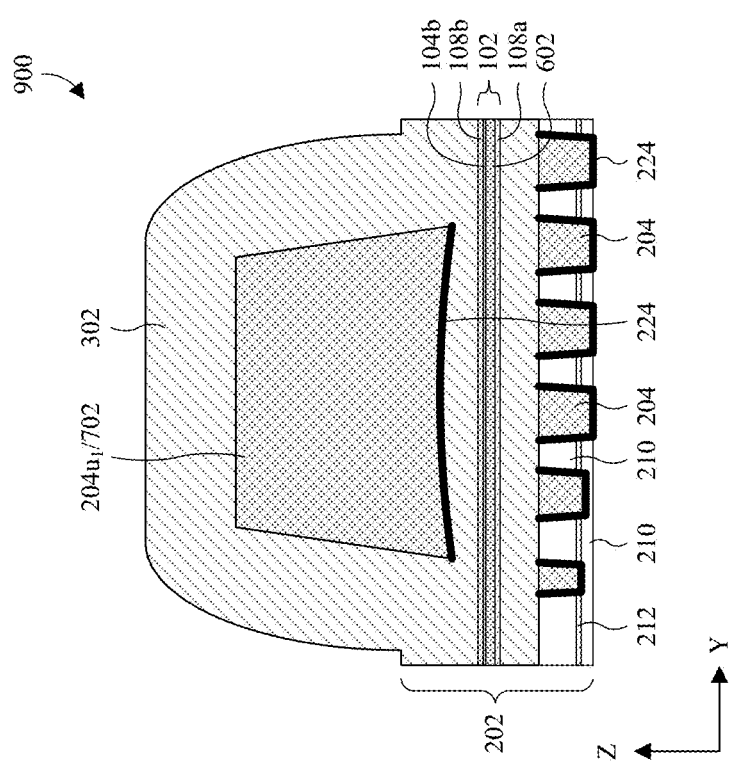
FIG. 9 illustrates a cross-sectional view of some alternative embodiments of the IC chip of FIG. 8B.

With reference to FIG. 9, a cross-sectional view 900 of some alternative embodiments of the IC chip of FIG. 8B is provided in which additional wires 204 are below the first upper capacitor wire 204$u_1$ and the MIM capacitor 102.

Figure 10:
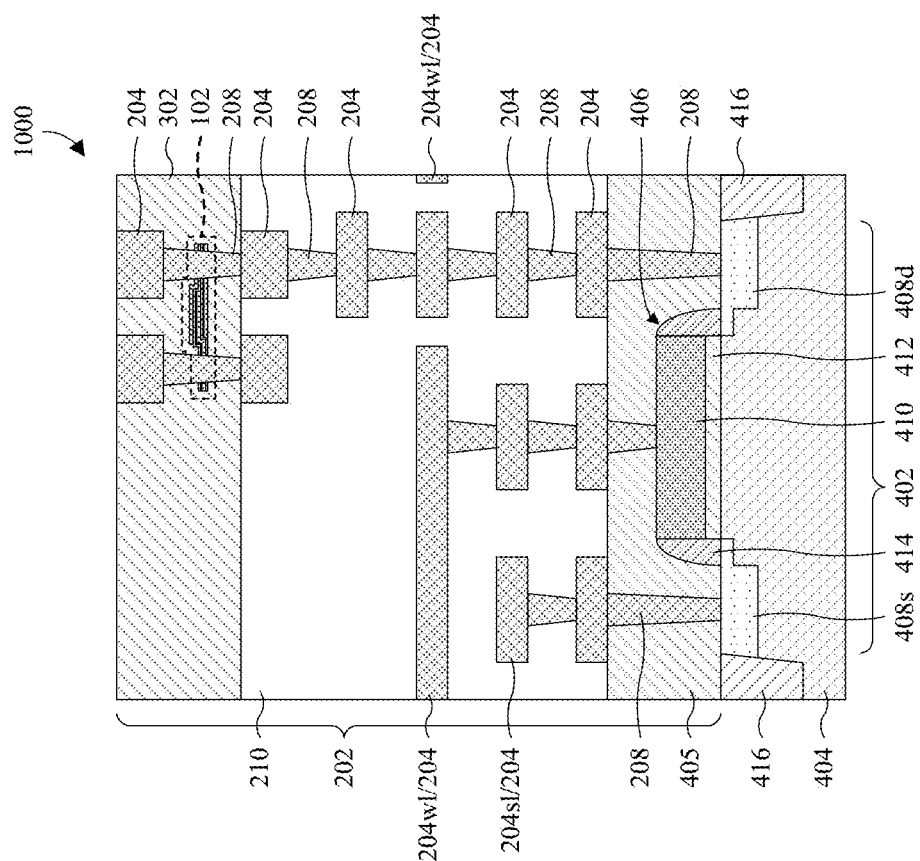
FIG. 10 illustrates a cross-sectional view of some embodiments of an IC chip comprising a 1T1C cell in which the MIM capacitor of FIG. 6C is embedded.

With reference to FIG. 10, a cross-sectional view 1000 of some embodiments of an IC chip comprising a 1T1C cell 402 is provided in which the MIM capacitor 102 of FIG. 6C is embedded. The 1T1C 402 may, for example, be as in FIG. 4A, except for inclusion of the MIM capacitor 102 of FIG. 6C instead of the MIM capacitor of FIG. 2A. In some alternative embodiments of the IC chip, the MIM capacitor 102 of FIG. 6C is replaced with the MIM capacitor 102 in any one of FIGS. 6A and 6B or some other suitable MIM capacitor. In some alternative embodiments of the IC chip in which the MIM capacitor 102 of FIG. 6C is replaced with the MIM capacitor of FIG. 6A, the MIM capacitor 102 of FIG. 6A is located in the IMD layer 210 instead of the passivation layer 302 as shown in FIG. 6A.

Figure 11:
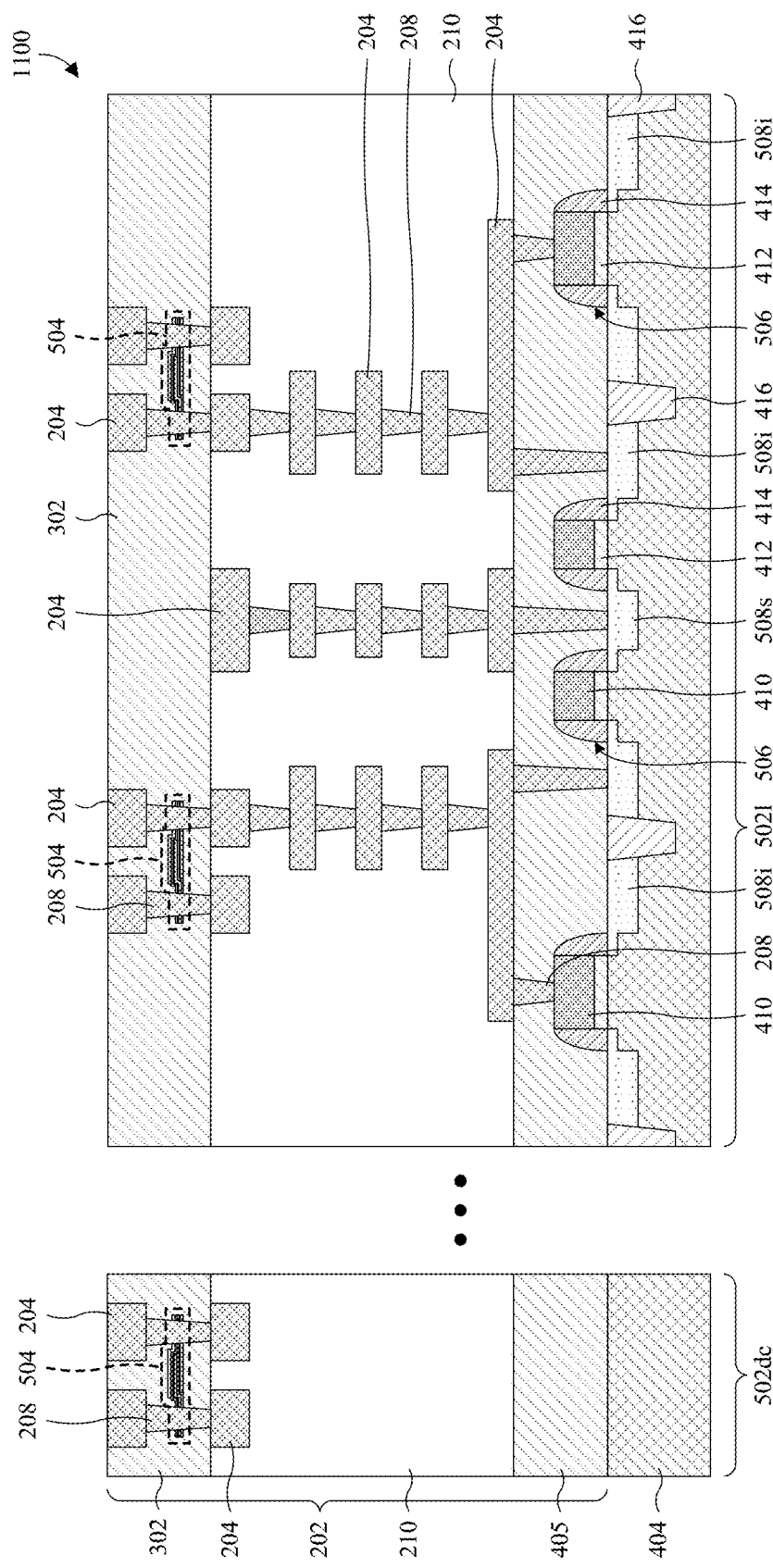
FIG. 11 illustrates a cross-sectional view of some embodiments of an IC chip comprising a decoupling-capacitor region and a logic region in which MIM capacitors are at the decoupling-capacitor and logic regions and configured as the MIM capacitor of FIG. 6C.

With reference to FIG. 11, a cross-sectional view 1100 of some embodiments of an IC chip comprising a decoupling-capacitor region 502dc and a logic region 502l is provided in which multiple MIM capacitors 504 are in the decoupling-capacitor and logic regions 502dc, 502l and are each configured as the MIM capacitor 102 of FIG. 6C. The decoupling-capacitor region 502dc and the logic region 502l may, for example, be as in FIG. 5, except that the MIM capacitors 504 are each configured as in FIG. 6C instead of as in FIG. 2B. In some alternative embodiments of the IC chip, the MIM capacitors 504 are each configured as the MIM capacitor 102 in any one of FIGS. 6A and 6B or some other suitable MIM capacitor.

While the MIM capacitor 102 in the IC chip of FIG. 10 is shown as being between the fifth and sixth wire levels, the MIM capacitor 102 may be between any other neighboring wire levels in alternative embodiments. Similarly, while the MIM capacitors 504 in the IC chip of FIG. 11 are shown as being between the fifth and sixth wire levels, the MIM capacitors 504 may be between any other neighboring wire levels in alternative embodiments. Further, while the MIM capacitor 102 in the IC chip of FIG. 10 is shown as being in the passivation layer 302, the MIM capacitor 102 may be in the IMD layer 210 or the ILD layer 405 in alternative embodiments. Similarly, while the MIM capacitors 504 in the IC chip of FIG. 11 are shown as being in the passivation layer 302, the MIM capacitors 504 may be in the IMD layer 310 or the ILD layer 405 in alternative embodiments.

Figure 12A:
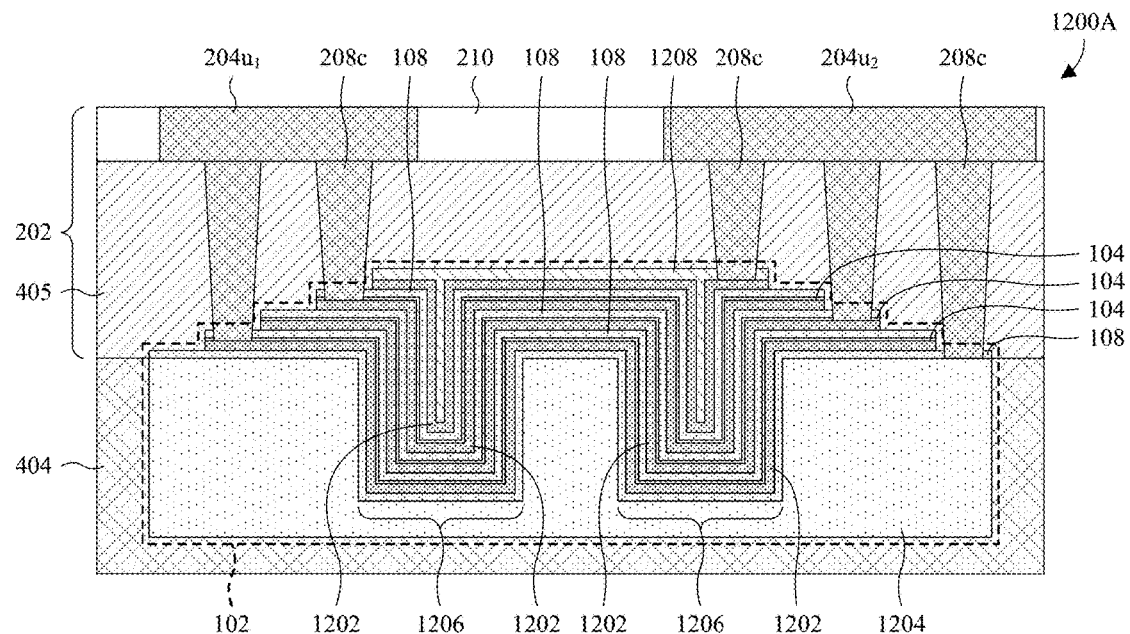
FIGS. 12A and 12B illustrates cross-sectional views of some embodiments of an IC chip comprising a substrate in which second trench embodiments of the MIM capacitor of FIG. 1 are embedded.

With reference to FIG. 12A, a cross-sectional view 1200A of some embodiments of an IC chip comprising a substrate 404 is provided in which second trench embodiments of the MIM capacitor 102 of FIG. 1 are embedded. The second trench embodiments are to be contrasted with the first trench embodiments in FIGS. 2A-2E. In the first trench embodiments, the MIM capacitor 102 is in a trench in an interconnect structure 202 overlying the substrate 404. In the second trench embodiments, the MIM capacitor 102 is in a trench in the substrate 404.

The MIM capacitor 102 comprises a plurality of trench electrodes 1202 and a substrate electrode 1204. In alternative embodiments, the substrate electrode 1204 is omitted.

The trench electrodes 1202 define one or more trench segments 1206 protruding into the substrate 404, whereas the substrate electrode 1204 corresponds to a doped region of the substrate 404 that surrounds the trench segment(s) 1206. The trench electrodes 1202 overlie the substrate electrode 1204 and are vertically stacked. Further, widths of the trench electrodes 1202 increase from a top of the vertical stack to a bottom of the vertical stack.

A plurality of capacitor interfacial layers 104 and a plurality of capacitor insulator layers 108 are also stacked with the trench electrodes 1202 and the substrate electrode 1204. The capacitor insulator layers 108 separate the trench electrodes 1202 from each other and from the substrate electrode 1204. The capacitor insulator layers 108 may, for example, be as described with regard to FIG. 1. Except for the topmost one of the trench electrodes 1202, the trench electrodes 1202 have top surfaces covered respectively by the capacitor interfacial layers 104. The capacitor interfacial layers 104 may, for example, be as described with regard to FIG. 1 and, except for the topmost one of the trench electrodes 1202, the trench electrodes 1202 may, for example, be as the bottom electrode 106 of FIG. 1 is described. Hence, the capacitor interfacial layers 104 have high adhesion to the trench electrodes 1202 and reduce dielectric breakdown. The topmost one of the trench electrodes 1202 may, for example, be as the top electrode 110 of FIG. 1 is described. In some embodiments, the capacitor insulator layers 108 and/or the capacitor interfacial layers 104 each has a same top layout as an immediately underlying electrode (e.g., a substrate or trench electrode). In some embodiments, a cap layer 1208 overlies the topmost one of the trench electrodes 1202 and fills gaps at the trench segments 1206.

The interconnect structure 202 overlies the MIM capacitor 102 and comprises a first upper capacitor wire $204u_1$ and a second upper capacitor wire $204u_2$. Further, the interconnect structure 202 comprises a plurality of capacitor vias 208c. The capacitor vias 208c electrically couple every other electrode of the MIM capacitor 102, from a bottom of the MIM capacitor 102 to a top of the MIM capacitor 102, to the second upper capacitor wire $204u_2$. Further, the capacitor vias 208c electrically couple remaining electrodes of the MIM capacitor 102 to the first upper capacitor wire $204u_1$. An ILD layer 405 surrounds the MIM capacitor 102 and the capacitor vias 208c, and an IMD layer 210 overlies the ILD layer 405 and surrounds the first and second upper capacitor wires $204u_1$, $204u_2$.

Figure 12B:
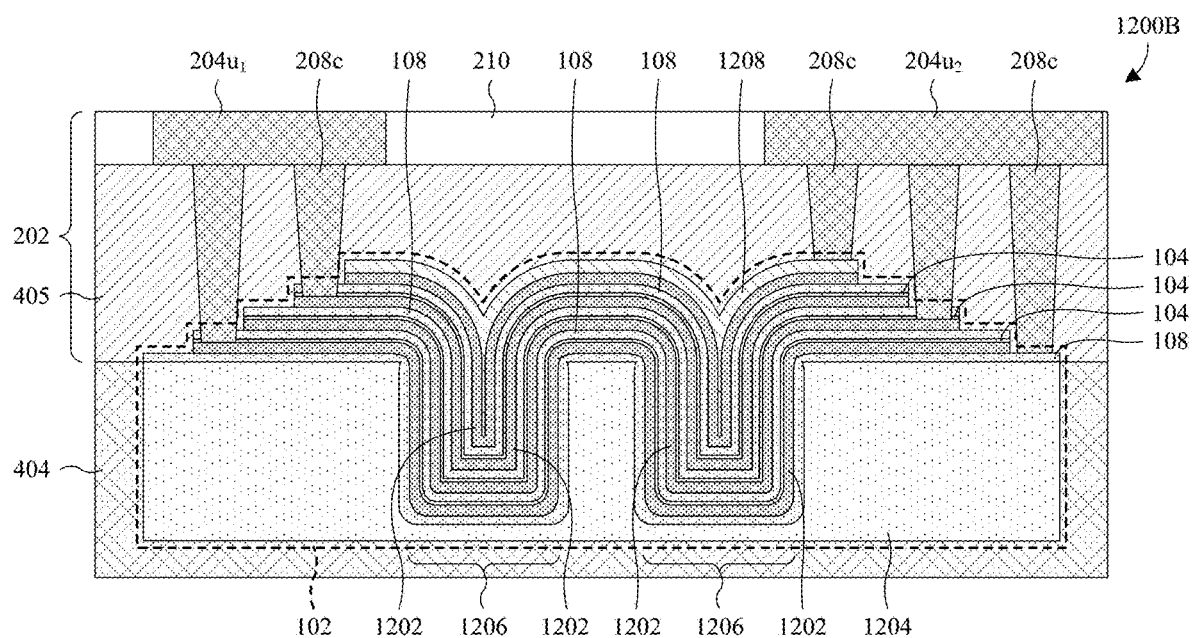

With reference to FIG. 12B, a cross-sectional view 1200B of some alternative embodiments of the IC chip of FIG. 12A is provided in which edges of the MIM capacitor 102 have a more rounded profile.

Figure 13:
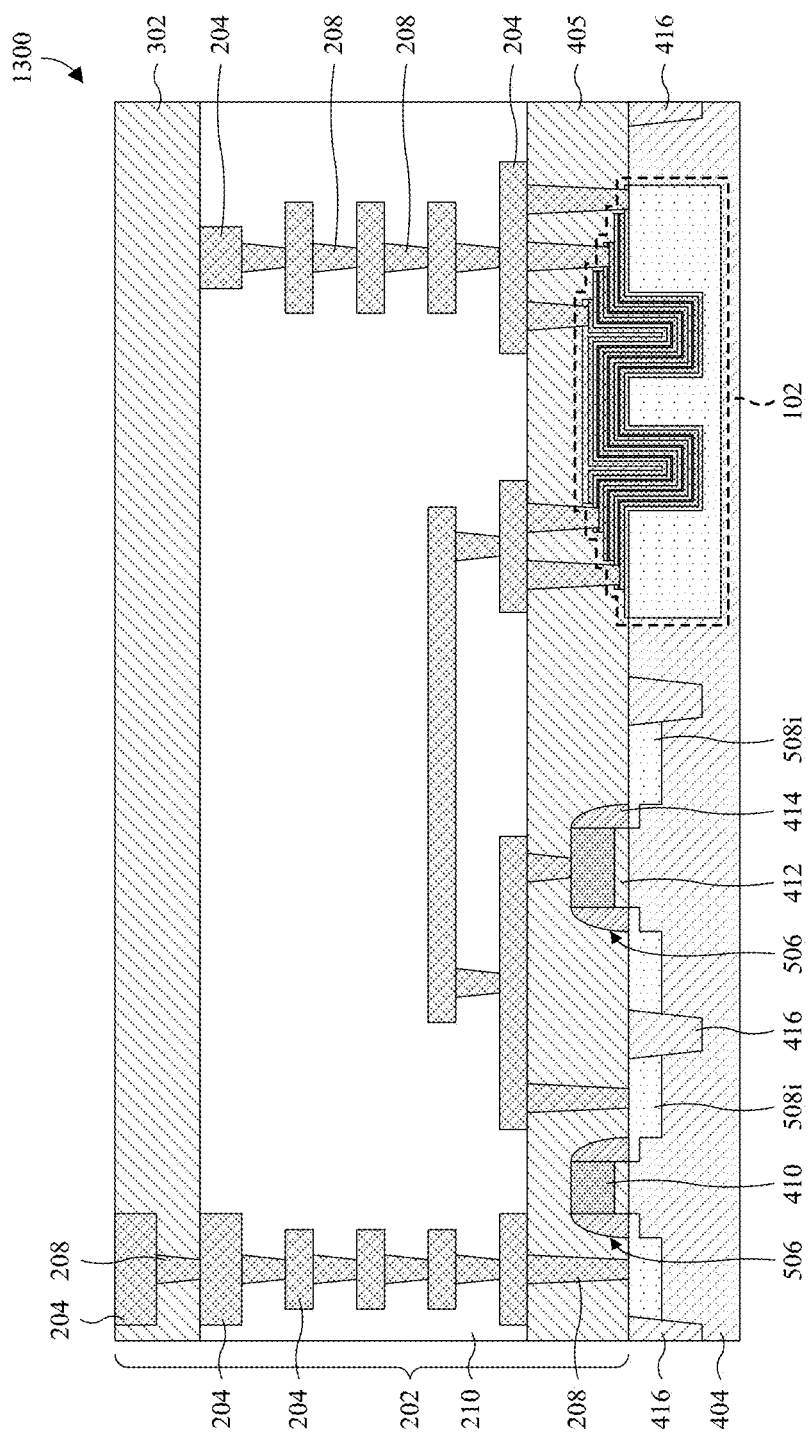
FIG. 13 illustrates an expanded cross-sectional view of some embodiments of the IC chip of FIG. 12A.

With reference to FIG. 13, an expanded cross-sectional view 1300 of some embodiments of the IC chip of FIG. 12A is provided in which more of the interconnect structure 202 is shown and multiple transistors 506 neighbor the MIM capacitor 102 on the substrate 404. In some alternative embodiments of the IC chip, the MIM capacitor 102 of FIG. 12A is replaced with the MIM capacitor 102 of FIG. 12B or some other suitable MIM capacitor. The interconnect structure 202 comprises the ILD layer 405, the IMD layer 210 overlying the ILD layer 405, and a passivation layer 302 overlying the IMD layer 210. Further, the interconnect structure 202 comprises a plurality of wires 204 and a plurality of vias 208 stacked in the ILD, IMD, and passivation layers 405, 210, 302. The wires 204 and the vias 208 are conductive and define conductive paths leading from the MIM capacitors 504 and also from the transistors 506.

The transistors 506 may, for example, each be configured as the transistor 506 of FIG. 5 and/or may, for example, each be an IGFET or some other suitable transistor. The transistors 506 comprise individual source/drain regions 508i, individual gate electrodes 410, and individual gate dielectric layers 412. The gate electrodes 410 overlie the gate dielectric layers 412 and are each sandwiched between two of the individual source/drain regions 508i. In some embodiments, sidewall spacer structures 414 are individual to the gate electrodes 410 and line sidewalls of the gate electrodes 410. In some embodiments, the transistors 506 and/or the MIM capacitor 102 are surrounded and separated by a trench isolation structure 416.

With reference to FIGS. 14-22, a series of cross-sectional views 1400-2200 of some embodiments of a method for forming an IC chip comprising a MIM capacitor is provided in which the MIM capacitor comprises an interfacial layer enhanced to reduce breakdown failure. The IC chip formed by the method may, for example, be the IC chip of FIG. 4A and/or the MIM capacitor may, for example, be as described with regard to FIG. 2A.

Figure 14:
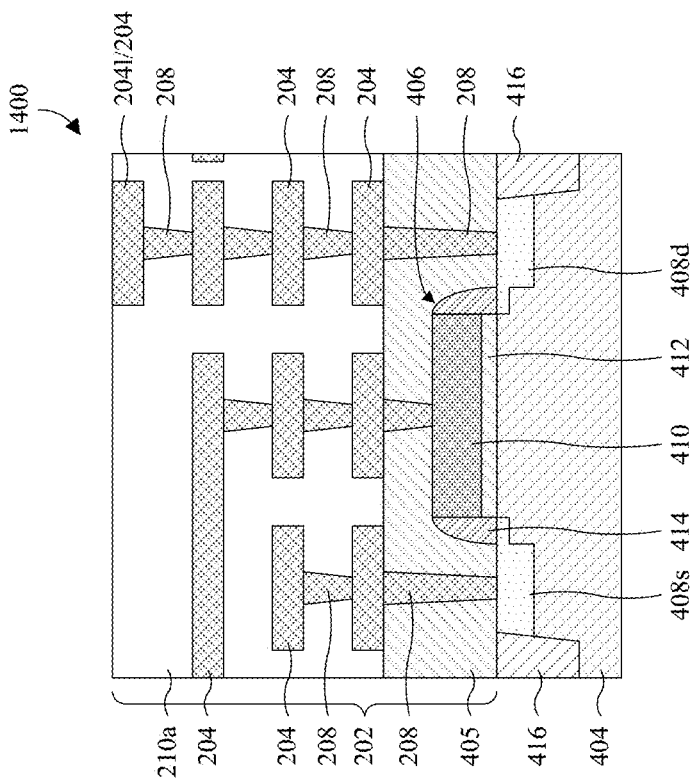

As illustrated by the cross-sectional view 1400 of FIG. 14, a trench isolation structure 416 and an access transistor 406 are formed on the substrate 404. The trench isolation structure 416 is formed extending into a top of the substrate 404 and has a pair of segments that are laterally spaced. The trench isolation structure 416 may, for example, be a shallow trench isolation (STI) structure or some other suitable trench isolation structure. The access transistor 406 is formed between the segments of the trench isolation structure 416 after the trench isolation structure 416 is formed. The access transistor 406 comprises a gate dielectric layer 412, a gate electrode 410 overlying the gate dielectric layer 412, and a sidewall spacer structure 414 on sidewalls of the gate electrode 410. Further, the access transistor 406 comprises a source region 408s and a drain region 408d between which the gate electrode 410 is sandwiched. The access transistor 406 may, for example, be an IGFET or some other suitable transistor.

Also illustrated by the cross-sectional view 1400 of FIG. 14, an interconnect structure 202 is partially formed over and electrically coupled to the access transistor 406. The interconnect structure 202 comprises an ILD layer 405 and a first IMD layer 210a overlying the ILD layer 405. Further, the interconnect structure 202 comprises a plurality of wires 204 and a plurality of vias 208 stacked in the ILD layer 405 and the first IMD layer 210a. The plurality of wires 204 and the plurality of vias 208 define a conductive path leading from the access transistor 406 to a lower capacitor wire 204l of the plurality of wires 204. The lower capacitor wire 204l is at a top of the interconnect structure 202 and provides a base for a MIM capacitor hereafter formed on the lower capacitor wire 204l.

Figure 15:
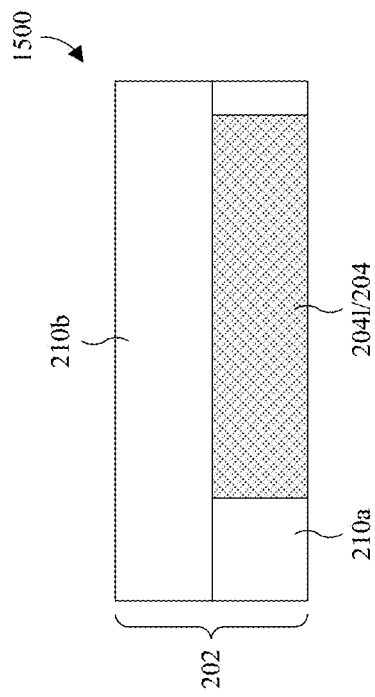
FIGS. 14-22 illustrate a series of cross-sectional views of some embodiments of a method for forming an IC chip in which a MIM capacitor comprises an interfacial layer enhanced to reduce breakdown failure.

As illustrated by the cross-sectional view 1500 of FIG. 15, a second IMD layer 210b is deposited on the lower capacitor wire 204l. For drawing compactness, a portion of the interconnect structure 202 underlying the lower capacitor wire 204l is not shown herein (i.e., in FIG. 15) and hereafter (i.e., in FIGS. 16-22). In some alternative embodiments, an etch stop layer (e.g., 212 in FIG. 2A) is first deposited on the lower capacitor wire 204l to separate the second IMD layer 210b from the lower capacitor wire 204l.

Figure 16:
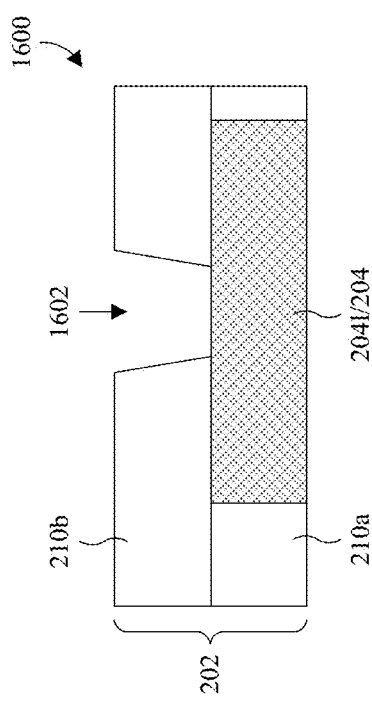

As illustrated by the cross-sectional view 1600 of FIG. 16, the second IMD layer 210b is patterned to form a trench 1602 overlying and exposing the lower capacitor wire 204l.

The patterning may, for example, be performed by a photolithography/etching process or some other suitable etching process.

Figure 17:
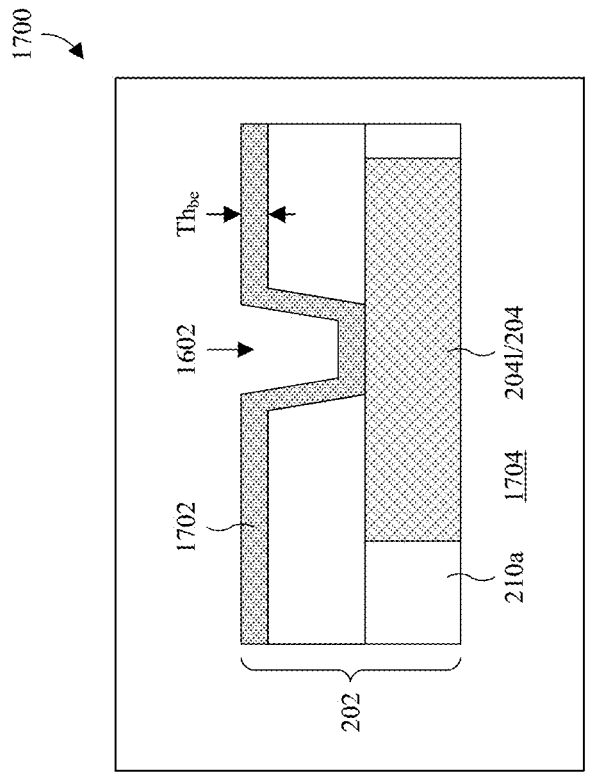

As illustrated by the cross-sectional view 1700 of FIG. 17, a bottom electrode layer 1702 is deposited on the second IMD layer 210b and lining the trench 1602 in a first process chamber 1704. In some embodiments, the bottom electrode layer 1702 is deposited by thermal ALD. In alternative embodiments, the bottom electrode layer 1702 is deposited by PVD or some other suitable deposition process. The bottom electrode layer 1702 is conductive and may, for example, be or comprise titanium, titanium nitride, tantalum, tantalum nitride, some other suitable conductive material(s), or any combination of the foregoing. In some embodiments, a thickness $Th_{be}$ of the bottom electrode layer 1702 is about 150-400 angstroms, about 150-275 angstroms, or about 275-400 angstroms. Other thicknesses are, however, amenable for the bottom electrode layer 1702.

Figure 18:
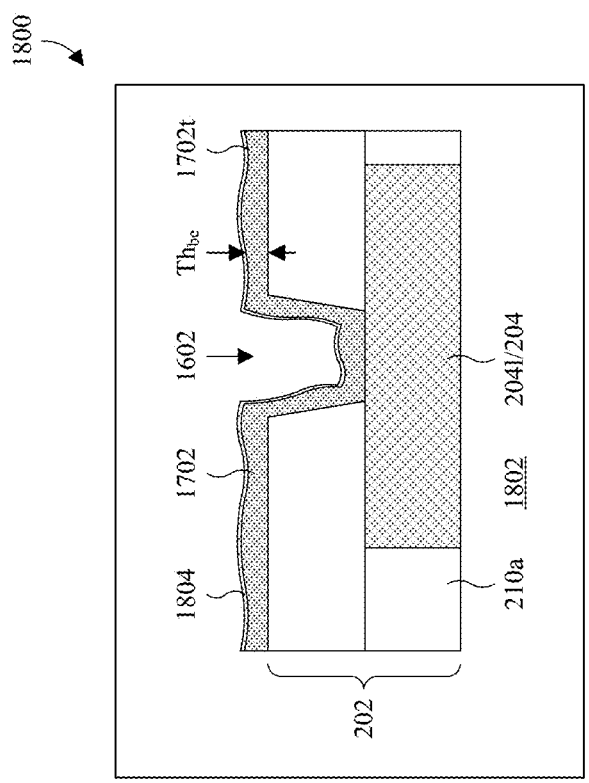

As illustrated by the cross-sectional view 1800 of FIG. 18, the bottom electrode layer 1702 and structure underlying the bottom electrode layer 1702 are transferred to a second process chamber 1802. In doing so, the top surface 1702t of the bottom electrode layer 1702 is exposed to air and oxidizes. The oxidation partially consumes the bottom electrode layer 1702 to recess the top surface 1702t of the bottom electrode layer 1702 and decrease the thickness $Th_{be}$ of the bottom electrode layer 1702. Further, the oxidation increases an average roughness of the top surface 1702t of the bottom electrode layer 1702 and forms a native oxide layer 1804 on the top surface 1702t. The increased average surface roughness degrades electrical field uniformity for a MIM capacitor hereafter formed from the bottom electrode layer 1702 and may lead to non-uniformity in operating parameters of the MIM capacitor when manufactured in bulk.

In some embodiments, surface roughness is quantified according to atomic force microscopy. Other processes are, however, amenable. In some embodiment, the average surface roughness of the bottom electrode layer 1702 is about 0.70-0.80 nanometers, about 0.72 nanometers, greater than about 0.70 nanometers, or some other suitable value according to atomic force microscopy. In some embodiments, because of the increase in average surface roughness, total thickness variation (TTV) of the bottom electrode layer 1702 is increased. TTV is a difference between a smallest value of the thickness $Th_{be}$ of the bottom electrode layer 1702 and a largest value of the thickness $Th_{be}$.

The native oxide layer 1804 has low adhesion with the bottom electrode layer 1702. In some embodiments, adhesion strength is quantified by nanoscratch testing. Other processes are, however, amenable for quantifying adhesion. Nanoscratch testing may, for example, comprise applying a linearly increasing force to a layer (e.g., the native oxide layer 1804) using a probe until adhesive failure. The force at which adhesive failure occurs represents adhesion strength. The more adhesive the layer is, the greater the force at which adhesive failure occurs. In some embodiment, the low adhesion strength of the native oxide layer 1804 is less than about 500 or 1000 micronewtons according to nanoscratch testing. Other adhesion values are, however, amenable. Below an adhesion of about 1000 micronewtons or some other suitable adhesion value, delamination and dielectric breakdown may be high, especially at high temperatures and/or high voltages.

Figure 19:
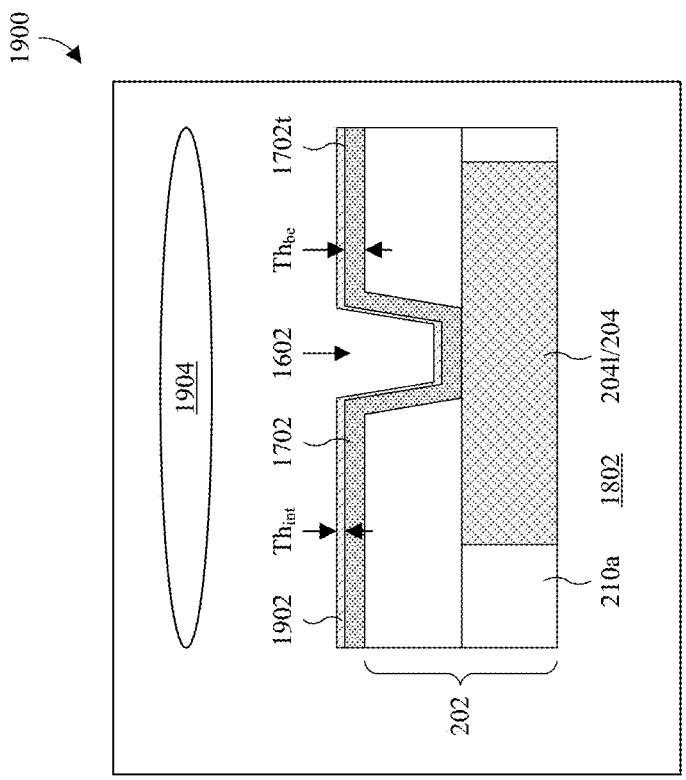

As illustrated by the cross-sectional view 1900 of FIG. 19, the native oxide layer 1804 and the top surface 1702t of the bottom electrode layer 1702 are plasma treated in the second process chamber 1802 to form an interfacial layer 1902 in place of the native oxide layer 1804. The plasma treatment converts the native oxide layer 1804 and an upper portion of the bottom electrode layer 1702 into the interfacial layer 1902. As such, the plasma treatment recesses the top surface 1702t of the bottom electrode layer 1702 and decreases the thickness $Th_{be}$ of the bottom electrode layer 1702. Further, ion bombardment from the plasma treatment erodes the native oxide layer 1804 and smooths the top surface 1702t of the bottom electrode layer 1702, thereby improving electric field uniformity for a MIM capacitor hereafter formed.

The plasma treatment comprises generating plasma 1904 from a process gas and subsequently exposing the native oxide layer 1804 and the top surface 1702t of the bottom electrode layer 1702 to the plasma 1904. The process gas and/or ions from the plasma 1904 diffuse into to the native oxide layer 1804 and/or the bottom electrode layer 1702 to form the interfacial layer 1902. In some embodiments, the process gas comprises, consists essentially of, or consists of nitrous oxide. In alternative embodiments, the process gas comprises, consists essentially of, or consists of ammonia and/or ozone. In some embodiments, the plasma treatment generates the plasma 1904 using: 1) a power of about 200-1900 watts, about 200-550 watts, or some other suitable value; 2) a pressure of about 1.0-3.0 torr, about 1.0-2.0 torr, or some other suitable value; 3) a flow rate for the process gas that is about 10000-20000 standard cubic centimeters per minute (SCCM), about 10000-14000 SCCM, or some other suitable value; 4) or any combination of the foregoing. In some embodiments, the plasma treatment has one or more cycles and each of the cycles exposes the native oxide layer 1804 and the top surface 1702t of the bottom electrode layer 1702 to the plasma 1904 for about 5-60 seconds, about 5-20 seconds, or some other suitable value. In some embodiments, the cycles have a 25%, 50%, or 75% duty cycle, where ON time corresponds to exposure and OFF time corresponds to no exposure.

In some embodiment, the process treatment comprises: 1) generating the plasma 1904 at a power of about 1800 watts, a pressure of about 2.5 torr, and a nitrous-oxide flow rate of about 18000 SCCM; and 2) exposing the native oxide layer 1804 and the bottom electrode layer 1702 to the plasma for about 45 seconds. In some embodiment, the process treatment comprises: 1) generating the plasma 1904 at a power of about 500 watts, a pressure of about 1.6 torr, and a nitrous-oxide flow rate of about 12000 sccm; and 2) exposing the native oxide layer 1804 and the bottom electrode layer 1702 to the plasma for about 10 seconds. In some embodiments, the process treatment has four cycles and comprises: 1) generating the plasma 1904 at a power of about 400-600 watts or about 500 watts; and 2) exposing the native oxide layer 1804 and the bottom electrode layer 1702 to the plasma 1904 for about 40-50 seconds, or about 45 seconds, for each cycle. In some embodiments, the process treatment has two cycles and comprises: 1) generating the plasma 1904 at a power of about 200-300 watts or about 250 watts; and 2) exposing the native oxide layer 1804 and the bottom electrode layer 1702 to the plasma 1904 for about 5-15 seconds, or about 10 seconds, for each cycle.

Because of the plasma treatment, which may be performed at relatively low cost, the interfacial layer 1902 is conductive throughout, from a topmost surface of the interfacial layer 1902 to a bottommost surface of the interfacial layer 1902. Further, the interfacial layer 1902 has a high adhesion strength with the bottom electrode layer 1702 compared to the native oxide layer 1804. In some embodiment, the high adhesion strength is about 1000-3000 micronewtons or greater than about 1000 micronewtons according to nanoscratch testing. Other adhesion values are, however, amenable. Below an adhesion of about 1000 micronewtons or some other suitable adhesion value, delamination of the interfacial layer 1902 may be high. Hence, because of the high adhesion strength, the likelihood of the interfacial layer 1902 delaminating (i.e., reaching adhesive failure) is low. This, in turn, reduces dielectric breakdown for a MIM capacitor being formed and increases TDDB for the MIM capacitor.

The interfacial layer 1902 may, for example, be or comprise titanium oxynitride, tantalum oxynitride, some other suitable conductive material(s), or any combination of the foregoing. In some embodiments, the interfacial layer 1902 is or comprises $TiO_xN_y$. In some embodiments, x is greater than 0 and less than about 2 and y is less than about x. In some of such embodiments, y is also greater than 0. In alternative embodiments, x and y have other suitable values. In some embodiments, x decreases from a top surface of the interfacial layer 1902 to a bottom surface of the interfacial layer 1902 and/or y increases from the top surface to the bottom surface. The decrease and/or the increase may, for example, be continuous. In some embodiments, the bottom electrode layer 1702 comprises or consists of a metal element and non-metal element and the interfacial layer 1902 comprises or consists of oxygen, the metal element, and the non-metal element. The metal element may, for example, be titanium, tantalum, or some other suitable metal element, and/or the non-metal element may, for example, be nitrogen or some other suitable non-metal element. In alternative embodiments, the bottom electrode layer 1702 consists of or consists essentially of the metal element and the interfacial layer 1902 comprises or consists of oxygen, the metal element, and the non-metal element.

In some embodiments, the interfacial layer 1902 is a diffusion barrier for at least an oxidant used during a subsequent deposition of an insulator layer. In some embodiments, the interfacial layer 1902 has a thickness $Th_{int}$ between about 20-50 angstroms, about 20-35 angstroms, about 35-50 angstroms, or some other suitable thickness. If the thickness $Th_{int}$ is too small (e.g., less than about 20 angstroms or some other suitable value), the interfacial layer 1902 may be unable to block diffusion of the oxidant during the subsequent deposition of the insulator layer. Further, process limitations may limit the thickness $Th_{int}$ to less than about 50 angstroms or some other suitable value. When the thickness $Th_{int}$ of the interfacial layer 1902 becomes too large (e.g., greater than about 50 angstroms or some other suitable value), crystalline quality is poor and hence adhesion to the bottom electrode layer 1702 is poor. Further, a portion of the interfacial layer 1902 may become dielectric. For example, when the bottom electrode layer 1702 is titanium nitride, titanium oxide may form. The dielectric portion results in a parasitic capacitance in series with a main capacitance of the MIM capacitor being formed. Because of the series relationship, the overall capacitance of the MIM capacitor is degraded. Further, the dielectric portion may have a low energy band gap that increases leakage current in the MIM capacitor and increases CV dispersion.

Figure 20:
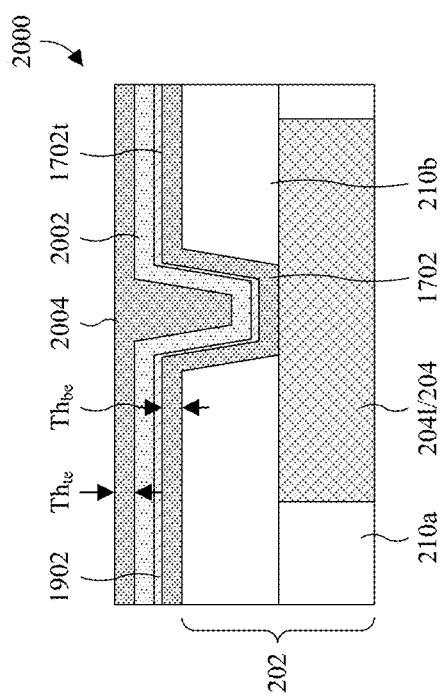

As illustrated by the cross-sectional view 2000 of FIG. 20, an insulator layer 2002 is deposited on the interfacial layer 1902. The insulator layer 2002 is dielectric and may, for example, be or comprise, zirconium oxide, aluminum oxide, hafnium oxide, silicon oxide, some other suitable dielectric(s), or any combination of the foregoing. In some embodiments, the insulator layer 2002 is or comprises a metal oxide and/or is or comprises a high k dielectric. A high k dielectric may, for example, be a dielectric material having a dielectric constant greater than about 10 or some other suitable value. The insulator layer 2002 may, for example, be deposited by ALD or some other suitable deposition process.

In at least some embodiments in which the insulator layer 2002 is deposited by ALD, the interfacial layer 1902 is exposed to an oxidant during the deposition. The oxidant may, for example, be or comprise ozone, water vapor, or some other suitable oxidant. As noted above, in some embodiments, the interfacial layer 1902 is a diffusion barrier for the oxidant. Absent the interfacial layer 1902 being a diffusion barrier for the oxidant, the oxidant could diffuse to the bottom electrode layer 1702 and oxidize the top surface 1702t of the bottom electrode layer 1702 during deposition of the insulator layer 2002. The oxidation would reduce a thickness $T_{be}$ of the bottom electrode layer 1702 and would hence make it difficult to control the thickness $T_{be}$. For example, the thickness $T_{be}$ of the bottom electrode layer 1702 may be reduced by an uncontrollable amount. As another example, roughness of the top surface 1702t of the bottom electrode layer 1702 may be increased and/or TTV of the bottom electrode layer 1702 may be increased. Additionally, the oxidation would form an oxide layer on the bottom electrode layer 1702. For example, where the bottom electrode layer 1702 is or comprise titanium nitride, the oxidation may form a titanium oxide layer. The oxide layer would be dielectric and create a parasitic capacitance in series with the primary capacitance of a MIM capacitor being formed. Because of the series relationship, overall capacitance of the MIM capacitor would be degraded. Further, the oxide layer may have a low energy band gap that acts as a step for charge carriers to reach a sufficiently high energy level to pass through the insulator layer 2002. Hence, the oxide layer may increase leakage current in a MIM capacitor being formed. Additionally, the increased leakage current may increase CV dispersion of the MIM capacitor.

Also illustrated by the cross-sectional view 2000 of FIG. 20, a top electrode layer 2004 is deposited over the insulator layer 2002, filling a remainder of the trench 1602 (see FIG. 19). The top electrode layer 2004 may, for example, be deposited by thermal ALD, PVD, or some other suitable deposition process. The top electrode layer 2004 is conductive and may, for example, be or comprise titanium, titanium nitride, tantalum, tantalum nitride, some other suitable conductive material(s), or any combination of the foregoing. In some embodiments, the top electrode layer 2004 is or comprises a same material as the bottom electrode layer 1702. In some embodiments, a thickness $Th_{te}$ of the top electrode layer 2004 is 400-600 angstroms, about 400-500 angstroms, about 500-600 angstroms, or some other suitable thickness.

Figure 21:
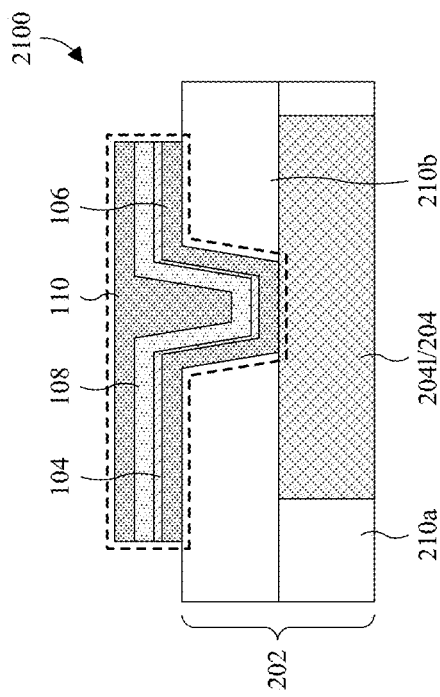

In some embodiments, an anneal is performed to the top electrode layer 2004 after depositing the top electrode layer 2004 and before the acts described hereafter at FIG. 21. The anneal may, for example, be or comprise a rapid thermal anneal (RTA) or some other suitable anneal. The anneal may, for example, be performed at about 350-450 degrees Celsius, about 400 degrees Celsius, or some other suitable temperature. The anneal may, for example, be performed for about 8-12 hours, about 10 hours, or some other suitable duration. In some embodiments, the anneal is or comprise an RTA performed at about 400 degrees for about 10 hours.

As illustrated by the cross-sectional view 2100 of FIG. 21, the top electrode layer 2004 (see, e.g., FIG. 20), the insulator layer 2002 (see, e.g., FIG. 20), the interfacial layer 1902

(see, e.g., FIG. 20), and the bottom electrode layer 1702 (see, e.g., FIG. 20) are patterned to form a MIM capacitor 102 overlying the lower capacitor wire 204*l*. The MIM capacitor 102 comprises a bottom electrode 106, a capacitor interfacial layer 104, a capacitor insulator layer 108, and a top electrode 110 vertically stacked. The patterning may, for example, be performed by a photolithography/etching process or some other suitable etching process.

Figure 22:
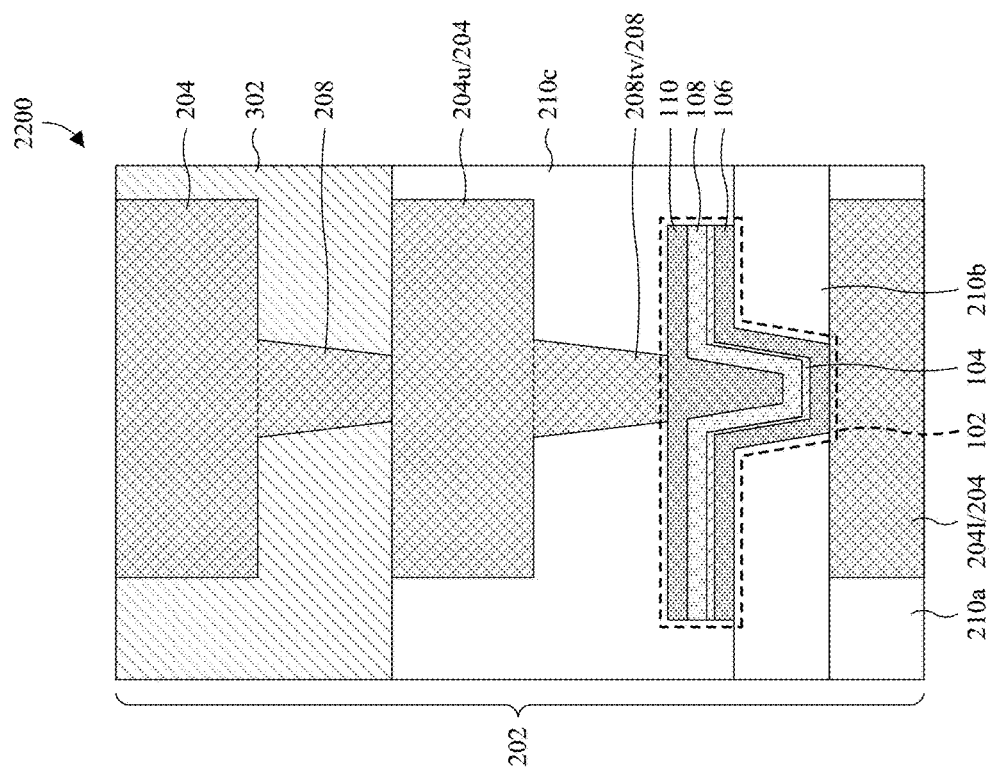

As illustrated by the cross-sectional view 2200 of FIG. 22, the interconnect structure 202 is completed around the MIM capacitor 102. Upon completion, the interconnect structure 202 comprises a third IMD layer 210*c* overlying the MIM capacitor 102 and further comprises a passivation layer 302 overlying the third IMD layer 210*c*. Further, the interconnect structure 202 comprises a plurality of additional wires 204 and a plurality of additional vias 208 in the third IMD layer 210*c* and the passivation layer 302. The plurality of additional wires 204 comprises an upper capacitor wire 204*u*, and the plurality of additional vias 208 comprises a TEVA 208*tv* extending from the upper capacitor wire 204*u* to the top electrode 110.

While not shown, breakdown failure testing may be performed on the MIM capacitor 102 after completing the interconnect structure 202. The breakdown failure testing applies a high voltage across the MIM capacitor 102, from the bottom electrode 106 to the top electrode 110. The high voltage may, for example, be a voltage greater than about 3.5 volts, between about 3.0-4.0 volts, or some other suitable voltage. In some embodiments, an ambient environment of the MIM capacitor 102 has a temperature of about 125 degrees Celsius, 100-150 degrees Celsius, greater than about 100 degrees Celsius, or some other suitable temperature. Because the capacitor interfacial layer 104 has high adhesion with the bottom electrode 106, the likelihood of the capacitor interfacial layer 104 delaminating from the bottom electrode 106 is low even at the high electric fields induced by the high voltage. Accordingly, the likelihood of dielectric breakdown is low and TDDB is high for the MIM capacitor 102. For example, TDDB may be greater than about 10 years or some other suitable duration. As another example, there may be less than about 0.001 failures per centimeter squared, or some other suitable number of failures per centimeter squared, when the MIM capacitor 102 is manufactured in bulk.

While FIGS. 14-22 are described with reference to a method, it will be appreciated that the structures shown in FIGS. 14-22 are not limited to the method but rather may stand alone separate of the method. While FIGS. 14-22 are described as a series of acts, it will be appreciated that the order of the acts may be altered in other embodiments. While FIGS. 14-22 illustrate and describe as a specific set of acts, some acts that are illustrated and/or described may be omitted in other embodiments. Further, acts that are not illustrated and/or described may be included in other embodiments. For example, while the illustrated and/or described acts form embodiments of the MIM capacitor 102 in FIG. 2A, illustrated and/or describes acts may be omitted and/or non-illustrated acts may be included to form the MIM capacitor 102 according to embodiments in any one of FIGS. 2B-2E, 6A-6C, 12A, and 12B. In some embodiments, to form the MIM capacitor 102 according to embodiments in FIGS. 6A-6C, the patterning at FIG. 16 is omitted. In some embodiments, to form the MIM capacitor 102 according to embodiments in FIGS. 21A and 12B, the acts at FIGS. 14 and 15 are omitted and the patterning at FIG. 16 is performed into the substrate 404.

Figure 23:
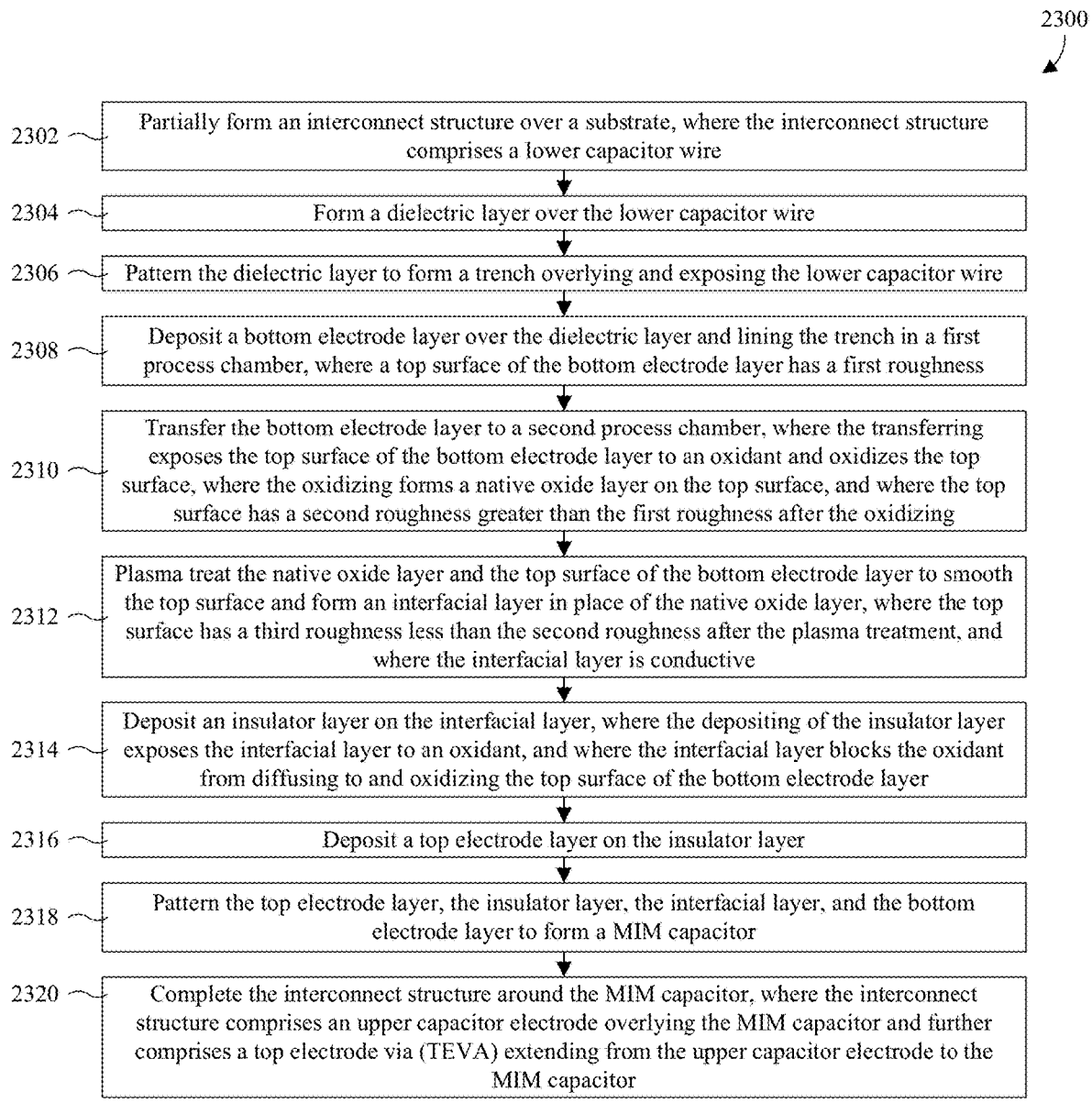
FIG. 23 illustrates a block diagram of some embodiments of the method of FIGS. 14-22.

With reference to FIG. 23, a block diagram 2300 of some embodiments of the method of FIGS. 14-22 is provided. The method may, for example, be employed to form a MIM capacitor according to the embodiments at FIGS. 2A-2E. Further, alternative embodiments of the method may, for example, be employed to form the MIM capacitor according to the embodiments at FIGS. 6A-6C, 12A, and 12B.

At 2302, an interconnect structure is partially formed over a substrate, where the interconnect structure comprises a lower capacitor wire. See, for example, FIG. 14.

At 2304, a dielectric layer is formed over the lower capacitor wire. See, for example, FIG. 15.

At 2306, the dielectric layer is patterned to form a trench overlying and exposing the lower capacitor wire. See, for example, FIG. 16.

At 2308, a bottom electrode layer is deposited over the dielectric layer and lining the trench in a first process chamber, where a top surface of the bottom electrode layer has a first average surface roughness. See, for example, FIG. 17. In alternative embodiments of the method, the patterning at 2306 is skipped so no trench is formed. Such alternative embodiments may, for example, be employed to form a MIM capacitor according to the embodiments at FIGS. 6A-6C. In alternative embodiments of the method, the acts at 2302 and 2304 are skipped and the patterning at 2306 is performed to the substrate. Such alternative embodiments may, for example, be employed to form a MIM capacitor according to the embodiments at FIGS. 12A and 12B.

At 2310, the bottom electrode layer is transferred to a second process chamber, where the transferring exposes the top surface of the bottom electrode layer to an oxidant and oxidizes the top surface, where the oxidizing forms a native oxide layer on the top surface, and where the top surface has a second average surface roughness greater than the first average surface roughness after the oxidizing. See, for example, FIG. 18.

At 2312, the native oxide layer and the top surface of the bottom electrode layer are plasma treated to smooth the top surface and form an interfacial layer in place of the native oxide layer, where the top surface has a third average surface roughness less than the second average surface roughness after the plasma treatment, and where the interfacial layer is conductive. See, for example, FIG. 19. The plasma may, for example, be generated from a process gas being or comprising nitrous oxide and/or some other suitable process gas(es). In alternative embodiments of the method, the transferring at 2310 is skipped and the plasma treatment is performed in the first process chamber. See, for example, FIG. 19.

At 2314, an insulator layer is deposited on the interfacial layer, where the depositing of the insulator layer exposes the interfacial layer to an oxidant, and where the interfacial layer blocks the oxidant from diffusing to and oxidizing the top surface of the bottom electrode layer. See, for example, FIG. 20. The insulator layer may, for example, be or comprise a metal oxide, a high k dielectric having a dielectric constant greater than about 10, some other suitable dielectric, or any combination of the foregoing.

At 2316, a top electrode layer is deposited on the insulator layer. See, for example, FIG. 20.

At 2318, the top electrode layer, the insulator layer, the interfacial layer, and the bottom electrode layer are patterned to form a MIM capacitor. See, for example, FIG. 21. When forming the MIM capacitor according to embodiments in FIGS. 2A-2D, the patterning may, for example, be performed by a photolithography/etching process or some other suitable patterning process. When forming the MIM capacitor according to embodiments in FIG. 2E, the patterning may, for example, be performed by a planarization process to a top surface of the dielectric layer or by some other suitable patterning process.

At 2320, the interconnect structure is completed around the MIM capacitor, where the interconnect structure comprises an upper capacitor electrode overlying the MIM capacitor and further comprises a TEVA extending from the upper capacitor electrode to the MIM capacitor. See, for example, FIG. 22.

While the block diagram 2300 of FIG. 23 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides a method including: depositing a bottom electrode layer over a substrate; forming a native oxide layer on a top surface of the bottom electrode layer, wherein the native oxide layer has a first adhesion strength with the top surface of the bottom electrode layer; performing a plasma treatment process to replace the native oxide layer with an interfacial layer, wherein the interfacial layer is conductive and has a second adhesion strength with the top surface of the bottom electrode layer, and wherein the second adhesion strength is greater than the first adhesion strength; depositing an insulator layer on the interfacial layer; depositing a top electrode layer on the insulator layer; and patterning the top and bottom electrode layers, the insulator layer, and the interfacial layer to form a MIM capacitor. In some embodiments, the performing of the plasma treatment process reduces a thickness of the bottom electrode layer. In some embodiments, the bottom electrode layer includes titanium nitride, wherein the performing of the plasma treatment process includes: generating plasma from nitrogen oxide; and exposing the native oxide layer to the plasma, wherein nitrogen and oxygen diffuse into the native oxide layer and the bottom electrode layer to form a titanium oxynitride layer from the native oxide layer and a top portion of the bottom electrode layer. In some embodiments, the method further includes annealing the top and bottom electrode layers, the insulator layer, and the interfacial layer. In some embodiments, the method further includes patterning the substrate to form a trench, wherein the bottom electrode layer, the insulator layer, and the top electrode layer are deposited in the trench. In some embodiments, the method further includes: forming an alternating stack of wires and vias over the substrate; depositing a dielectric layer over the alternating stack; and patterning the dielectric layer to form a trench, wherein the bottom electrode layer, the insulator layer, and the top electrode layer are deposited in the trench.

In some embodiments, the present application provides another method including: depositing a bottom electrode layer over a substrate in a first process chamber; transferring the bottom electrode layer to a second process chamber, wherein a top surface of the bottom electrode layer has a first roughness upon completion of the transferring; plasma treating the top surface of the bottom electrode layer in the second process chamber, wherein the plasma treating forms an interfacial layer on the top surface of the bottom electrode layer, wherein the top surface of the bottom electrode layer has a second roughness less than the first roughness upon completion of the plasma treating; depositing an insulator layer on the interfacial layer; depositing a top electrode layer on the insulator layer; and patterning the top and bottom electrode layers, the insulator layer, and the interfacial layer to form a MIM capacitor. In some embodiments, the interfacial layer is exposed to an oxidant during the depositing of the insulator layer, wherein the interfacial layer blocks the oxidant from diffusing through the interfacial layer to the bottom electrode layer. In some embodiments, a thickness of the bottom electrode layer is a same before the depositing of the insulator layer as after the depositing of the insulator layer. In some embodiments, the bottom electrode layer includes titanium nitride, wherein the plasma treating forms plasma from nitrous oxide and exposes the top surface of the bottom electrode layer to the plasma. In some embodiments, the plasma treating includes generating plasma in the second process chamber and exposing the top surface of the bottom electrode layer to the plasma in the second process chamber, wherein the plasma is generated at a power of about 200-550 watts and at a pressure of about 1-2 torr, and wherein the top surface of the bottom electrode layer is exposed to the plasma for about 5-20 seconds. In some embodiments, the exposing of the top surface of the bottom electrode layer to the plasma is repeated multiple times. In some embodiments, the generating of the plasma includes introducing nitrous oxide into the second process chamber at a flow rate of about 10000-14000 SCCM.

In some embodiments, the present application provides a MIM capacitor including: a bottom electrode including a metal element and a non-metal element; an insulator layer overlying the bottom electrode; a top electrode overlying the insulator layer; and an interfacial layer between the bottom electrode and the insulator layer, wherein the interfacial layer directly contacts a top surface of the bottom electrode and is conductive, and wherein the interfacial layer includes the metal element, the non-metal element, and oxygen. In some embodiments, the interfacial layer is configured to block diffusion of oxygen from a top surface of the interfacial layer to the top surface of the bottom electrode. In some embodiments, the metal element includes titanium or tantalum, wherein the non-metal element includes nitrogen. In some embodiments, the interfacial layer includes titanium oxynitride, wherein an atomic percentage of oxygen in the interfacial layer decreases from top to bottom, and wherein an atomic percentage of nitrogen in the interfacial layer increases from top to bottom. In some embodiments, the interfacial layer includes titanium oxynitride, wherein an atomic percentage of oxygen in the interfacial layer is less than about 2 and greater than about 0, and wherein an atomic percentage of nitrogen in the interfacial layer is less than that of oxygen and greater than about 0. In some embodiments, the insulator layer includes a dielectric material having a dielectric constant greater than about 10. In some embodiments, the interfacial layer has a thickness of about 20-50 angstroms.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   depositing a bottom electrode layer over a substrate;
   forming a native oxide layer on a top surface of the bottom electrode layer, wherein the native oxide layer has a first adhesion strength with the top surface of the bottom electrode layer;
   performing a plasma treatment process to replace the native oxide layer with an interfacial layer, wherein the interfacial layer is conductive and has a second adhesion strength with the top surface of the bottom electrode layer, and wherein the second adhesion strength is greater than the first adhesion strength;
   depositing an insulator layer on the interfacial layer;
   depositing a top electrode layer on the insulator layer; and
   patterning the top and bottom electrode layers, the insulator layer, and the interfacial layer to form a metal-insulator-metal (MIM) capacitor;
   wherein the performing of the plasma treatment process comprises generating plasma and exposing the top surface of the bottom electrode layer to the plasma, and wherein the interfacial layer has a non-zero thickness and comprises oxygen when the generating of the plasma ends.

2. The method according to claim 1, wherein the bottom electrode layer comprises titanium nitride, and wherein the performing of the plasma treatment process comprises:
   generating the plasma from nitrogen oxide; and
   exposing the native oxide layer to the plasma, wherein nitrogen and oxygen diffuse into the native oxide layer and the bottom electrode layer to form a titanium oxynitride layer from the native oxide layer and a top portion of the bottom electrode layer.

3. The method according to claim 1, further comprising:
   forming an alternating stack of wires and vias over the substrate;
   depositing a dielectric layer over the alternating stack; and
   patterning the dielectric layer to form a trench, wherein the bottom electrode layer, the insulator layer, and the top electrode layer are deposited in the trench.

4. The method according to claim 1, further comprising:
   patterning the substrate to form a trench, wherein the bottom electrode layer, the insulator layer, and the top electrode layer are deposited in the trench.

5. The method according to claim 1, wherein the performing of the plasma treatment process reduces a thickness of the bottom electrode layer.

6. The method according to claim 1, further comprising:
   annealing the top and bottom electrode layers, the insulator layer, and the interfacial layer.

7. A method comprising:
   depositing a bottom electrode layer over a substrate, wherein the bottom electrode layer comprises a metal nitride;
   exposing a top surface of the bottom electrode layer to an oxygen-containing plasma, wherein the exposing forms an interfacial layer directly on the top surface of the bottom electrode layer;
   depositing a high k dielectric layer directly on the interfacial layer;
   depositing a top electrode layer directly on the high k dielectric layer;
   patterning the top and bottom electrode layers, the high k dielectric layer, and the interfacial layer to form a metal-insulator-metal (MIM) structure; and
   forming a native oxide layer overlying and directly contacting the top surface of the bottom electrode layer, wherein the exposing is performed while the native oxide layer is on the top surface and is performed such that the native oxide layer is fully removed, and replaced with the interfacial layer, at an end of the exposing;
   wherein the interfacial layer comprises oxygen at completion of the exposing.

8. The method according to claim 7, wherein an atomic percentage of oxygen in the interfacial layer decreases from top to bottom, and wherein an atomic percentage of nitrogen in the interfacial layer increases from top to bottom.

9. The method according to claim 7, wherein the interfacial layer is configured to block diffusion of oxygen from a top surface of the interfacial layer to the top surface of the bottom electrode layer.

10. The method according to claim 7, wherein the metal nitride comprises titanium nitride or tantalum nitride, and wherein the interfacial layer comprises titanium oxynitride or tantalum oxynitride.

11. The method according to claim 7, wherein the oxygen-containing plasma is nitrogen oxide (e.g., $N_2O$) plasma.

12. The method according to claim 7, wherein the exposing reduces a thickness of the bottom electrode layer.

13. The method according to claim 7, wherein the interfacial layer has a thickness of about 20-50 angstroms.

14. A method comprising:
    depositing a bottom electrode layer over a substrate in a first process chamber;
    transferring the bottom electrode layer to a second process chamber, wherein a top surface of the bottom electrode layer has a first roughness upon completion of the transferring;
    plasma treating the top surface of the bottom electrode layer in the second process chamber, wherein the plasma treating forms an interfacial layer on the top surface of the bottom electrode layer, wherein the top surface of the bottom electrode layer has a second roughness less than the first roughness upon completion of the plasma treating;
    depositing an insulator layer on the interfacial layer;
    depositing a top electrode layer on the insulator layer; and
    patterning the top and bottom electrode layers, the insulator layer, and the interfacial layer to form a metal-insulator-metal (MIM) capacitor;
    wherein the bottom electrode layer and the interfacial layer directly contact at an interface when the plasma treating ends, wherein the plasma treating comprises generating plasma and further comprises exposing the top surface of the bottom electrode layer and native oxide on the top surface to the plasma, and wherein plasma treating ends upon completion of the generating and the exposing.

15. The method according to claim 14, wherein the interfacial layer is exposed to an oxidant during the depositing of the insulator layer, and wherein the interfacial layer blocks the oxidant from diffusing through the interfacial layer to the bottom electrode layer.

16. The method according to claim 14, wherein the bottom electrode layer comprises titanium nitride, and wherein the plasma treating generates the plasma from nitrous oxide.

17. The method according to claim 14, wherein a thickness of the bottom electrode layer is a same before the depositing of the insulator layer as after the depositing of the insulator layer.

18. The method according to claim 14, wherein the plasma treating comprises generating the plasma in the second process chamber and exposing the top surface of the bottom electrode layer to the plasma in the second process chamber, wherein the plasma is generated at a power of about 200-550 watts and at a pressure of about 1-2 torr, and wherein the top surface of the bottom electrode layer is exposed to the plasma for about 5-20 seconds.

19. The method according to claim 18, wherein the generating of the plasma comprises introducing nitrous oxide into the second process chamber at a flow rate of about 10000-14000 standard cubic centimeters per minute (SCCM).

20. The method according to claim 1, wherein the performing of the plasma treatment process generates the plasma only once from a beginning of the plasma treatment process to an end of the plasma treatment process.

\* \* \* \* \*